US010187066B2

(12) United States Patent
Terasawa

(10) Patent No.: US 10,187,066 B2
(45) Date of Patent: Jan. 22, 2019

(54) ELECTRONIC DEVICE, METHOD OF MANUFACTURING ELECTRONIC DEVICE, ELECTRONIC APPARATUS, AND MOVING OBJECT

(71) Applicant: Seiko Epson Corporation, Tokyo (JP)

(72) Inventor: Katsuyoshi Terasawa, Shiojiri (JP)

(73) Assignee: Seiko Epson Corporation (JP)

( * ) Notice: Subject to any disclaimer, the term of this patent is extended or adjusted under 35 U.S.C. 154(b) by 164 days.

(21) Appl. No.: 15/245,506

(22) Filed: Aug. 24, 2016

(65) Prior Publication Data

US 2017/0063379 A1 Mar. 2, 2017

(30) Foreign Application Priority Data

Aug. 28, 2015 (JP) .................................. 2015-168817

(51) Int. Cl.
*H03L 1/00* (2006.01)
*H03L 1/02* (2006.01)
*H03L 1/04* (2006.01)

(52) U.S. Cl.
CPC .................. *H03L 1/04* (2013.01); *H03L 1/02* (2013.01); *H03L 1/026* (2013.01)

(58) Field of Classification Search
CPC . H03L 1/04; H03L 1/026; H03L 1/028; H03L 1/025; H03L 1/027; H03L 1/022; H03L 1/023; H03L 5/00; H03L 1/02; H03B 5/04; H03B 5/364; H03B 5/36; H03B 1/02; H03B 5/366; H03B 5/368; H03B 2200/0062; H03B 2200/0038

USPC ..................... 331/116 FE, 158, 176, 2, 175
See application file for complete search history.

(56) References Cited

U.S. PATENT DOCUMENTS

| | | | | |
|---|---|---|---|---|
| 6,161,003 A * | 12/2000 | Lo Curto | ................ | H03J 7/04 331/10 |
| 6,661,302 B1 * | 12/2003 | Rathore | ................ | H03L 1/023 331/158 |
| 8,669,825 B2 | 3/2014 | Terasawa | | |
| 8,779,974 B2 | 7/2014 | Terasawa et al. | | |
| 2012/0229225 A1 * | 9/2012 | Horie | ..................... | H02N 2/001 331/158 |

FOREIGN PATENT DOCUMENTS

| | | |
|---|---|---|
| JP | 2002-204127 A | 7/2002 |
| JP | 2011-234094 A | 11/2011 |
| JP | 2011-239053 A | 11/2011 |
| JP | 2012-227665 A | 11/2012 |

* cited by examiner

*Primary Examiner* — Arnold Kinkead
(74) *Attorney, Agent, or Firm* — Harness, Dickey & Pierce, P.L.C.

(57) ABSTRACT

An electronic device includes a drive section, a detection signal output section adapted to generate a first analog signal having a value varying in accordance with a physical quantity, and a control section adapted to generate a second analog signal controlled based on the first analog signal, and adapted to control a drive state of the drive section, at least the detection signal output section and the control section are provided to a substrate, and a first digital signal obtained by digitalizing the first analog signal and a second digital signal obtained by digitalizing the second analog signal can be output from the substrate.

12 Claims, 16 Drawing Sheets

ELECTRONIC DEVICE, METHOD OF MANUFACTURING ELECTRONIC DEVICE, ELECTRONIC APPARATUS, AND MOVING OBJECT

BACKGROUND

1. Technical Field

The present invention relates to an electronic device, a method of manufacturing an electronic device, an electronic apparatus, and a moving object.

2. Related Art

In JP-A-2002-204127 (Document 1), there is disclosed an adjustment device for adjusting a temperature compensated crystal oscillator (TCXO) constituted by an oscillation circuit using a crystal vibrator and a variable capacitance element, a temperature sensor, an A/D converter, a D/A converter, a CPU, a memory, and an integration circuit. The adjustment device described in Document 1 obtains control voltage data of the variable capacitance element using the frequency deviation-temperature characteristic of the crystal vibrator itself and an output signal of the temperature sensor output from the temperature compensated crystal oscillator, and then stores the control voltage data in the memory so as to correspond to the ambient temperature and the frequency deviation of the crystal vibrator.

In Document 1, the output signal of the temperature sensor output from the temperature compensated crystal oscillator is an analog signal to be input to the A/D converter, and is therefore easy to be deteriorated in accuracy by disturbance noise after being output from the temperature compensated crystal oscillator. As a result, since an influence of the disturbance noise is included in the control voltage data of the variable capacitance element obtained based on the output signal of the temperature sensor, there is a possibility that the error increases to deteriorate the temperature compensation accuracy. In particular, in the case of adjusting each of the oscillators in the state in which a number of oscillators operate at the same time such as the case of mass-producing the oscillators, since the influence of the disturbance noise is significant, it is extremely difficult to perform the adjustment with high accuracy.

SUMMARY

An advantage of some aspects of the invention is to provide an electronic device capable of reducing the adjustment error to thereby operate with high accuracy, and a method of manufacturing the electronic device. Another advantage of some aspects of the invention is to provide an electronic apparatus and a moving object using the electronic device.

The invention can be implemented as the following aspects and application examples.

Application Example 1

An electronic device according to this application example includes a drive section, a detection signal output section adapted to generate a first analog signal having a value varying in accordance with a physical quantity, and a control section adapted to generate a second analog signal controlled based on the first analog signal, and adapted to control a drive state of the drive section, at least the detection signal output section and the control section are provided to a substrate, and a first digital signal obtained by digitalizing the first analog signal and a second digital signal obtained by digitalizing the second analog signal can be output from the substrate.

The physical quantity can be, for example, a temperature, an angular velocity, or acceleration.

The substrate can be, for example, a package, a circuit board, or a silicon substrate.

Since the electronic device according to this application example is capable of outputting the first digital signal and the second digital signal difficult to be deteriorated in accuracy by noise from the substrate, it is possible for the external device to accurately adjust the electronic device based on the first digital signal and the second digital signal. Therefore, according to the present application example, it is possible to reduce the adjustment error to thereby realize an electronic device capable of operating with high accuracy.

Application Example 2

An electronic device according to this application example includes a drive section, a detection signal output section adapted to generate a first analog signal having a value varying in accordance with a physical quantity, a control section adapted to generate a second analog signal controlled based on the first analog signal, and adapted to control a drive state of the drive section based on an operation condition set, and an arithmetic section adapted to determine the operation condition based on a first digital signal obtained by digitalizing the first analog signal and a second digital signal obtained by digitalizing the second analog signal, and at least the detection signal output section and the control section are provided to a substrate.

It is possible for the electronic device according to this application example to accurately adjust the operation condition based on the first digital signal and the second digital signal difficult to be deteriorated in accuracy by noise. Therefore, according to the present application example, it is possible to reduce the adjustment error to thereby realize an electronic device capable of operating with high accuracy.

Application Examples 3, 4

In the electronic device according to the application example described above, the first analog signal may correspond to temperature information, the drive section may include an oscillation circuit, the control section may include a stabilization function adapted to stabilize a temperature characteristic of a frequency signal output by the oscillation circuit, and the second analog signal may correspond to information representing an operation state of the stabilization function.

According to these application examples, by reducing the adjustment error of the stabilization function of the temperature characteristic of the frequency signal output by the oscillation circuit, it is possible to realize an electronic device capable of operating with high frequency accuracy.

Application Examples 5, 6

In the electronic device according to the application examples described above, the oscillation circuit may include a reactance circuit to be voltage-controlled disposed in a feedback circuit, and the second analog signal may be a signal adapted to voltage-control reactance of the reactance circuit to compensate the temperature characteristic.

According to these application examples, by reducing the adjustment error of the stabilization function of the temperature characteristic of the frequency signal output by the oscillation circuit, it is possible to improve the accuracy of the voltage control of the reactance of the reactance circuit to thereby realize an electronic device capable of operating with high frequency accuracy.

Application Examples 7, 8

The electronic device according to the application examples described above may further include a heat generating section controlled in heat generation value based on the second analog signal, and the heat generating section may heat the drive section.

According to these application examples, by reducing the adjustment error of the stabilization function of the temperature characteristic of the frequency signal output by the oscillation circuit, it is possible to improve the accuracy of the heating control of the heat generating section to thereby realize an electronic device capable of operating with high frequency accuracy.

Application Example 9

The electronic device according to the application example described above, may further include an analog-to-digital conversion section adapted to perform the digitalization.

According to this electronic device related to the present application example, it is possible to generate the first digital signal and the second digital signal difficult to be deteriorated in accuracy by noise due to the analog-to-digital conversion section.

Application Example 10

A method of manufacturing an electronic device according to this application example includes the steps of assembling the electronic device including a drive section, a detection signal output section adapted to generate a first analog signal having a value varying due to a variation of a physical quantity, and a control section adapted to generate a second analog signal controlled based on the first analog signal, and control a drive state of the drive section based on an operation condition set, setting a temperature of the electronic device, measuring a first digital signal obtained by digitalizing the first analog signal and a second digital signal obtained by digitalizing the second analog signal at the temperature set, and determining the operation condition based on the first digital signal and the second digital signal measured.

According to the method of manufacturing an electronic device related to this application example, it is possible to measure the first digital signal and the second digital signal difficult to be deteriorated in accuracy by noise, and accurately adjust the operation condition of the electronic device based on the measurement result. Therefore, according to the present application example, it is possible to reduce the adjustment error to thereby manufacture an electronic device capable of operating with high accuracy.

Application Example 11

In the method of manufacturing an electronic device according to the application example described above, the measuring may be performed in a state of making a plurality of the electronic devices operate.

According to the method of manufacturing an electronic device related to this application example, even in the environment in which the noise is easily generated due to the operation of the plurality of electronic devices, it is possible to measure the first digital signal and the second digital signal difficult to be deteriorated in accuracy by noise, and accurately adjust the operation condition of the electronic device based on the measurement result. Therefore, according to the present application example, it is possible to reduce the adjustment error to thereby manufacture an electronic device capable of operating with high accuracy.

Application Example 12

An electronic apparatus according to this application example includes any one of the electronic devices described above.

Application Example 13

A moving object according to this application example includes any one of the electronic devices described above.

According to these application examples, since there is used the electronic device capable of operating with high accuracy, it is also possible to realize, for example, an electronic apparatus and a moving object high in reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Some preferred embodiments of the invention will hereinafter be described in detail using the accompanying drawings. It should be noted that the embodiments described below do not unreasonably limit the content of the invention as set forth in the appended claims. Further, all of the constituents described below are not necessarily essential elements of the invention.

1. Electronic Device

Although there is presented the description citing an oscillator as an example of the electronic device according to the invention, the invention can be applied to a variety of electronic devices such as a variety of types of physical quantity sensors such as an angular velocity sensor or an acceleration sensor besides the oscillator. Further, although temperature is cited as an example of the physical quantity, the physical quantity can be other quantities, and can also be, for example, angular velocity or acceleration.

1-1. First Embodiment

Configuration of Oscillator

Figure 1:
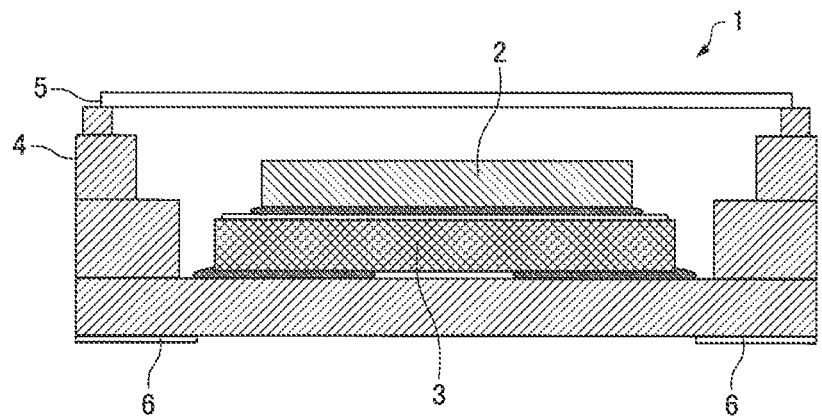
FIG. 1 is a diagram showing an example of a structure of an oscillator according to first and second embodiments of the invention.

FIG. 1 is a diagram showing an example of a structure of an oscillator according to a first embodiment, and is a cross-sectional view of the oscillator. As shown in FIG. 1, the oscillator 1 according to the first embodiment is configured including an integrated circuit (IC) 2, a vibrator 3, a package 4, a lid 5, and external terminals (external electrodes) 6.

The package 4 houses the integrated circuit (IC) 2 and the vibrator 3 in the same space. Specifically, the package 4 is provided with a recessed part, and the recessed part is covered with the lid 5 to thereby house the integrated circuit (IC) 2 and the vibrator 3. On the surfaces of the inside or the recessed part of the package 4, there is disposed the wiring not shown for electrically connecting two terminals of the integrated circuit (IC) 2 and two terminals of the vibrator 3 respectively to each other. Further, on the surfaces of the inside or the recessed part of the package 4, there are disposed wiring lines not shown electrically connected to the respective external terminals 6 disposed on the bottom surface of the package 4, and the wiring lines and the terminals of the integrated circuit (IC) 2 are respectively bonded (electrically connected) to each other with respective bonding wires (not shown).

The vibrator 3 is formed of a vibrator element not shown encapsulated in a package having high airtightness. The vibrator element has metal excitation electrodes respectively disposed on the obverse surface and the reverse surface of the vibrator element, and the vibrator 3 oscillates with a desired frequency corresponding to the mass of the vibrator element including the excitation electrodes.

It should be noted that as the vibrator 3, there can be adopted, for example, a quartz crystal vibrator, or besides the vibrator element of the type described above, a surface acoustic wave (SAW) resonator element. Further, besides the quartz crystal vibrator, there can be used other piezoelectric vibrators, an MEMS (Micro Electro Mechanical Systems) vibrator constituted by a piezoelectric film and a silicon material, or the like. As a substrate material of the vibrator 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the vibrator 3, there can be used a device using a piezoelectric effect, or electrostatic drive using a coulomb force.

The integrated circuit (IC) 2 is bonded to the vibrator 3 with an adhesive member.

Figure 2:
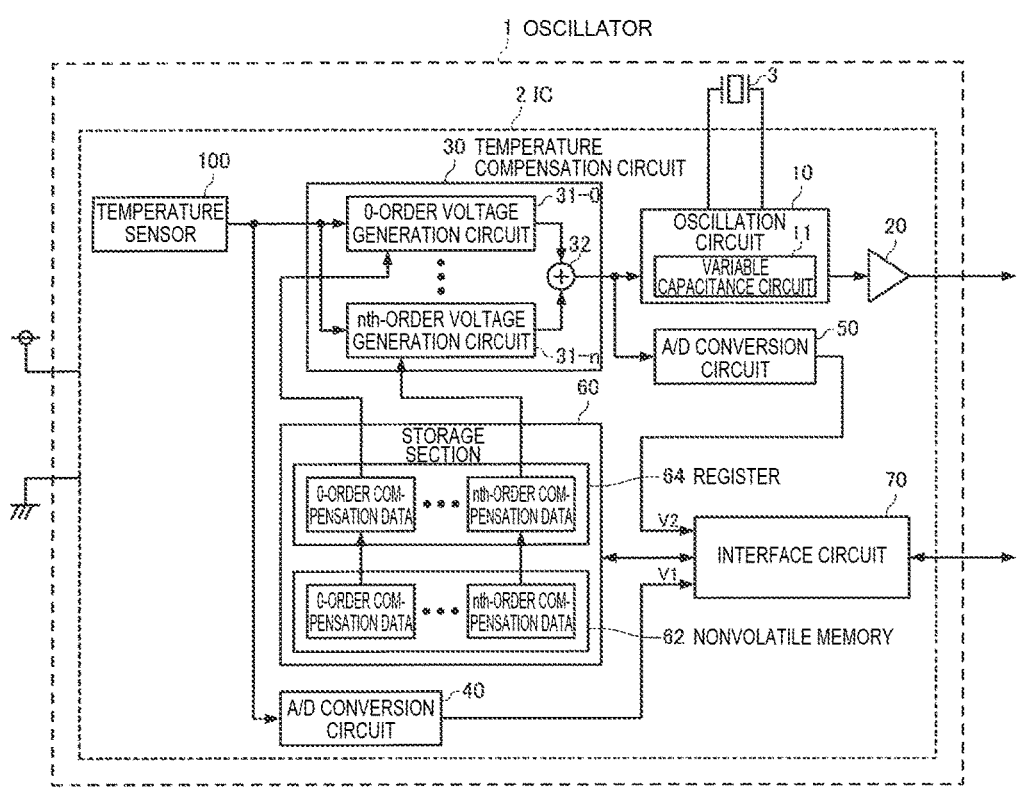
FIG. 2 is a functional block diagram of the oscillator according to the first embodiment.

FIG. 2 is a functional block diagram of the oscillator 1 according to the first embodiment. As shown in FIG. 2, the oscillator 1 according to the first embodiment includes the vibrator 3 and the integrated circuit (IC) 2 for oscillating the vibrator 3, and the integrated circuit (IC) 2 and the vibrator 3 are housed in the package 4.

In the present embodiment, the integrated circuit (IC) 2 is configured including an oscillation circuit 10, an output circuit 20, a temperature compensation circuit 30, an A/D conversion circuit 40, an A/D conversion circuit 50, a storage section 60, an interface circuit 70, and a temperature sensor 100. It should be noted that the integrated circuit (IC) 2 can have a configuration obtained by eliminating or modifying some of these constituents, or adding other constituents. Further, in the present embodiment, the oscillation circuit 10, the output circuit 20, the temperature compensation circuit 30, the A/D conversion circuit 40, the A/D conversion circuit 50, the storage section 60, the interface circuit 70, and the temperature sensor 100 are configured as a single integrated circuit (IC), but can also be constituted by two or more integrated circuits (IC). Further, at least a part of the oscillation circuit 10, the output circuit 20, the temperature compensation circuit 30, the A/D conversion circuit 40, the A/D conversion circuit 50, the storage section 60, the interface circuit 70, and the temperature sensor 100 is not required to be integrated, and can discretely be configured using, for example, a plurality of electronic components.

The storage section 60 has a nonvolatile memory 62 and a register 64, and is configured so that reading from and writing to the nonvolatile memory 62 or the register 64 can be performed from the external terminals 6 via the interface circuit 70. The interface circuit 70 can be an interface circuit compatible with a variety of types of serial bus such as SPI (Serial Peripheral Interface) or I²C (Inter-Integrated Circuit), or can also be an interface circuit compatible with a parallel bus. It should be noted that in order to reduce the number of the external terminals of the oscillator 1 to miniaturize the package 4, it is desirable to configure the interface circuit 70 as an interface circuit compatible with the serial bus.

The nonvolatile memory 62 is a storage section for storing a variety of types of control data, and is configured as a programmable ROM (programmable read-only memory (PROM)) to which data can be written. The nonvolatile memory 62 can be a variety of types of rewritable memory such as an electrically erasable programmable read-only memory (EEPROM), or can also be a variety of types of non-rewritable (writable only once) memory such as a one-time programmable read-only memory (one-time PROM).

The nonvolatile memory 62 stores 0-order through $n^{th}$-order compensation data as the temperature compensation data for controlling the temperature compensation circuit 30.

The temperature compensation data (the 0-order compensation data, . . . , $n^{th}$-order compensation data) are the data for compensating the frequency-temperature characteristic of the oscillator 1 and calculated in a temperature compensation adjustment process of the oscillator 1, and can also be, for example, 0-order through $n^{th}$-order coefficient values corresponding to the respective order components in the frequency temperature characteristic of the vibrator 3. Here, as the highest order n of the temperature compensation data, it is desirable to select a value with which the frequency-temperature characteristic of the vibrator 3 is canceled, and the temperature characteristic of the integrated circuit (IC) 2 can also be corrected. For example, the value n is an integer value greater than the principal order of the frequency-temperature characteristic of the vibrator 3, and if the vibrator 3 is an AT-cut quartz crystal vibrator, the frequency-temperature characteristic thereof exhibits a cubic curve, and the principal order thereof is 3, and therefore, an integer value (e.g., 4 or 5) greater than 3 can be selected as the value n. The temperature compensation data can include all of the 0-order through $n^{th}$-order compensation data, or some of the 0-order through $n^{th}$-order compensation data. It should be noted that the nonvolatile memory 62 can store control data for the oscillation circuit 10 and the output circuit 20.

Each of the data stored in the nonvolatile memory 62 is transferred from the nonvolatile memory 62 to the register 64, when powering on (when the voltage between the power terminals rises from 0 V to a desirable voltage) the integrated circuit (IC) 2, and is then held in the register 64. Thus, the temperature compensation data (the 0-order compensation data, . . . , the $n^{th}$-order compensation data) held in the register 64 are input to the temperature compensation circuit 30.

In the case in which the nonvolatile memory 62 is non-rewritable (write-once), in the manufacturing process (an inspection process) of the oscillator 1, each of the data is directly written into the register 64 from the external terminals 6 via the interface circuit 70 to be adjusted/selected so that the oscillator 1 fulfills the desired characteristic, and then each of the data thus adjusted/selected is finally written into the nonvolatile memory 62. In the case in which the nonvolatile memory 62 is rewritable, it is also possible to arrange that each of the data is written into the nonvolatile memory 62 from the external terminals 6 via the interface circuit 70 in the manufacturing process (the inspection process) of the oscillator 1. It should be noted that since writing to the nonvolatile memory 62 generally takes time, in order to shorten the inspection time of the oscillator 1, it is also possible to arrange that each of the data is directly written into the register 64 from the external terminals 6 via the interface circuit 70, and each of the data adjusted/selected is finally written into the nonvolatile memory 62.

The oscillation circuit 10 amplifies the output signal of the vibrator 3 to feedback the result to the vibrator 3 to thereby oscillate the vibrator 3, and then outputs a frequency signal (an oscillation signal) based on the oscillation of the vibrator 3. The oscillation circuit 10 is provided with a variable capacitance circuit 11 (an example of a reactance circuit), the capacitance (an example of a reactance) of which is voltage-controlled, disposed in the feed-back circuit to oscillate the vibrator 3 with a frequency corresponding to the value of the load capacitance. The variable capacitance circuit 11 functions as the load capacitance of the oscillation circuit 10, and can also include a variable capacitance element such as a varactor diode the capacitance value of which varies in accordance with the voltage applied to the both ends.

As the oscillation circuit 10, there can be adopted a circuit having a known variety of types of configurations, and the circuit constituted by the oscillation circuit 10 and the vibrator 3 can also be a variety of types of oscillation circuit such as a pierce oscillator circuit, an inverter type oscillation circuit, a Colpitts oscillator circuit, or a Hartley oscillator circuit. For example, the oscillation stage current of the oscillation circuit 10 can be controlled by the control data held in the register 64.

The frequency signal (the oscillation signal) output by the oscillation circuit 10 is input to the output circuit 20, and the output circuit 20 generates a frequency signal (an oscillation signal) for an external output, and then outputs the frequency signal to the outside via the external terminals 6. The output circuit 20 can also be a differential output circuit such as a low voltage differential signaling (LVDS) circuit, a positive emitter coupled logic (PECL) circuit, or a low voltage PECL (LVPECL) circuit, or can also be a single-ended output circuit. Further, it is also possible for the output circuit 20 to divide the frequency of the frequency signal (the oscillation signal) output by the oscillation circuit 10, and then output the oscillation signal thus divided. For example, the division ratio and the output level of the frequency signal (the oscillation signal) in the output circuit 20 can be controlled by the control data held in the register 64.

The temperature sensor 100 outputs a signal (e.g., a voltage corresponding to the temperature) corresponding to the ambient temperature of the temperature sensor 100. The temperature sensor 100 can be a positive type, in which the higher the temperature is, the higher the output voltage is, or can also be a negative type, in which the higher the temperature is, the lower the output voltage is. It should be noted that a device, the output voltage of which varies as linearly as possible with respect to the change in temperature in a desired temperature range in which the operation of the oscillator 1 is guaranteed is desirable as the temperature sensor 100. The temperature sensor 100 can also be, for example, a temperature detection circuit using a bandgap of a semiconductor, a thermistor (e.g., a negative temperature coefficient (NTC) thermistor, or a positive temperature coefficient (PTC) thermistor), or a platinum resistor.

The temperature compensation circuit 30 is provided with a temperature compensation function as a stabilization function for stabilizing the temperature characteristic of the frequency signal (the oscillation signal) output by the oscillation circuit 10 in accordance with the change in temperature as a disturbance, and the output signal from the temperature sensor 100 is input to the temperature compensation circuit 30, and the temperature compensation circuit 30 generates a temperature compensation signal as the information representing the operation state of the temperature compensation function. The temperature compensation signal is a signal for voltage-controlling the capacitance of the variable capacitance circuit 11 to compensate the temperature characteristic of the frequency signal (the oscillation signal) output by the oscillation circuit 10, and the voltage of the temperature compensation signal is applied to the variable capacitance circuit 11. Thus, the oscillation frequency of the oscillation circuit 10 is controlled so as to be constant irrespective of the temperature. In the present embodiment, the temperature compensation circuit 30 is configured including a 0-order voltage generation circuit 31-0 through an $n^{th}$-order voltage generation circuit 31-$n$, and an adder circuit 32.

The output signal of the temperature sensor 100 is input to each of the 0-order voltage generation circuit 31-0 through the $n^{th}$-order voltage generation circuit 31-$n$, and the 0-order voltage generation circuit 31-0 through the $n^{th}$-order voltage generation circuit 31-$n$ generate a 0-order compensation voltage through an $n^{th}$-order compensation voltage for compensating the 0-order component through the $n^{th}$-order component of the frequency-temperature characteristic in accordance with the 0-order compensation data through the $n^{th}$-order compensation data held in the register 64, respectively.

The adder circuit 32 adds the 0-order compensation voltage through the $n^{th}$-order compensation voltage respectively generated by the 0-order voltage generation circuit 31-0 through the $n^{th}$-order voltage generation circuit 31-$n$ to each other, and then outputs the result. The output signal of the adder circuit 32 becomes the output signal (the temperature compensation signal) of the temperature compensation circuit 30.

The A/D conversion circuit 40 is a circuit functioning as an analog-to-digital conversion section for converting the output signal (an analog signal as the temperature information) of the temperature sensor 100 into a digital signal. The digital signal converted by the A/D conversion circuit 40 is arranged to be able to be output (retrieved) from the external terminals 6 via the interface circuit 70.

The A/D conversion circuit 50 is a circuit functioning as an analog-to-digital conversion section for converting the temperature compensation signal (an analog signal as the information representing the operation state of the temperature compensation function) output by the temperature compensation circuit 30 into a digital signal. The digital signal converted by the A/D conversion circuit 50 is arranged to be able to be output (retrieved) from the external terminals 6 via the interface circuit 70.

The oscillator 1 according to the first embodiment configured as described above functions as a temperature compensated oscillator (temperature compensated crystal oscillator (TCXO) if the vibrator 3 is a quartz crystal vibrator) for outputting the frequency signal (the oscillation signal) with a frequency stable irrespective of the temperature in the desired temperature range in which the operation of the oscillator 1 is guaranteed. In particular, if the AT-cut quartz crystal vibrator, which has a third-order frequency-temperature characteristic, and is therefore relatively small in frequency deviation, is used as the vibrator 3, it is possible to realize the temperature compensated oscillator, the temperature compensation of which by the temperature compensation circuit 30 is relatively easy, and which is high in frequency stability.

Figure 3:
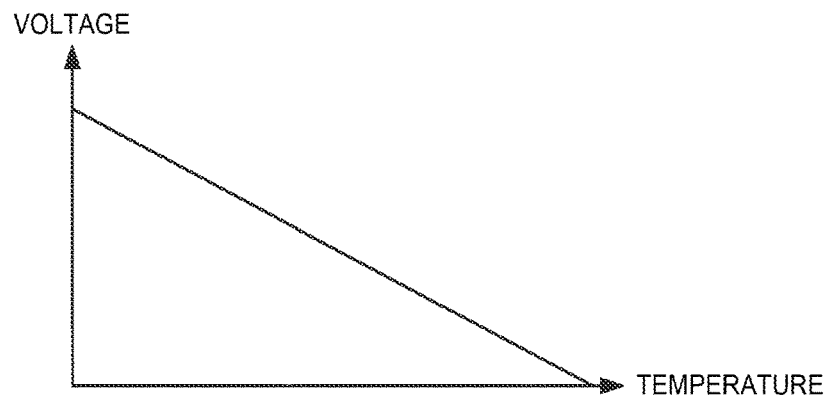
FIG. 3 is a diagram showing an example of a temperature characteristic of an output signal of a temperature sensor.
Figure 4:
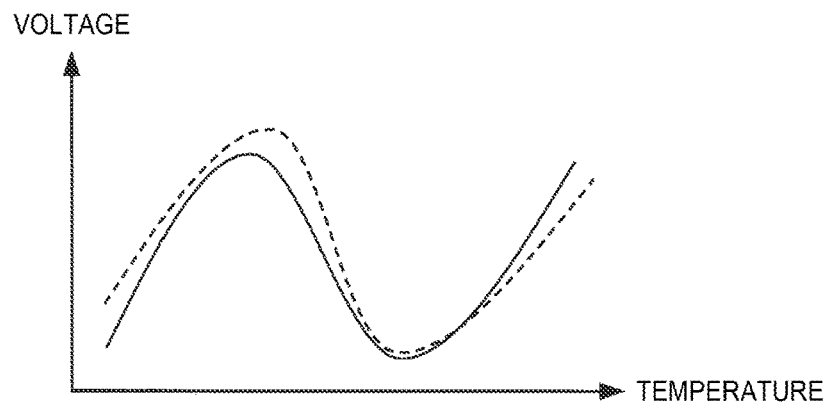
FIG. 4 is a diagram showing an example of a temperature characteristic of an output signal of a temperature compensation circuit.
Figure 5:
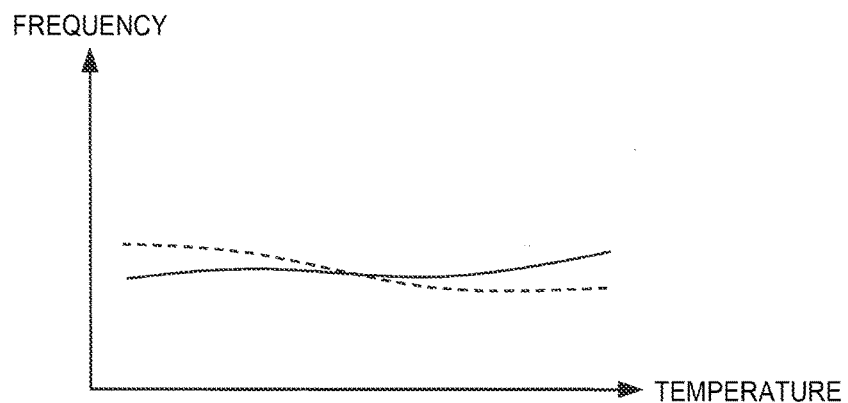
FIG. 5 is a diagram showing an example of a temperature characteristic of an output signal of an oscillation circuit.

FIG. 3 is a diagram showing an example of a temperature characteristic of the output signal of the temperature sensor 100. Further, FIG. 4 is a diagram showing an example of a temperature characteristic of the output signal (the temperature compensation signal) of the temperature compensation circuit 30. Further, FIG. 5 is a diagram showing an example of a temperature characteristic of the output signal (the frequency signal (the oscillation signal)) of the oscillation circuit 10. In FIG. 3, FIG. 4, and FIG. 5, the horizontal axis represents the temperature. Further, in FIG. 3 and FIG. 4, the vertical axis represents the voltage, and in FIG. 5, the vertical axis represents the frequency.

For example, in the case in which the vibrator 3 is the AT-cut quartz crystal vibrator, the frequency of the output signal of the oscillation circuit 10 has a cubic temperature characteristic. The higher the temperature is, the lower the voltage of the signal output by the temperature sensor 100 is, as shown in FIG. 3, and the temperature compensation circuit 30 outputs the temperature compensation signal having the cubic temperature characteristic as shown in FIG. 4 in accordance with the signal, and thus, the frequency signal (the oscillation signal) output by the oscillation circuit 10 approximates to a constant value irrespective of the temperature as shown in FIG. 5. As indicated by the solid line and the dotted line in FIG. 4, the temperature characteristic of the temperature compensation signal varies in accordance with the temperature compensation data, and thus, as indicated by the solid line and the dotted line in FIG. 5, the temperature characteristic of the frequency signal (the oscillation signal) also varies. In other words, since the temperature compensation circuit 30 controls the drive state of the circuit constituted by the oscillation circuit 10 and the vibrator 3 based on the temperature compensation data (an example of the drive condition) thus set, by appropriately setting the temperature compensation data, it is possible to approximate the frequency of the frequency signal (the oscillation signal) to a highly constant value irrespective of the temperature.

It should be noted that the oscillator 1 corresponds to an "electronic device" according to the invention. Further, the voltage controlled oscillation circuit constituted by the oscillation circuit 10 and the vibrator 3 corresponds to a "drive section" according to the invention. Further, the temperature sensor 100 corresponds to a "detection signal output section for generating a first analog signal, the value of which varies due to the variation of the physical quantity (the temperature)." Further, the temperature compensation circuit 30 corresponds to a "control section for generating a second analog signal controlled based on the first analog signal (the output signal of the temperature sensor 100), and controlling the drive state of the drive section (the voltage controlled oscillation circuit constituted by the oscillation circuit 10 and the vibrator 3)" according to the invention. Further, the digital signal output by the A/D conversion circuit 40 corresponds to a "first digital signal obtained by digitalizing the first analog signal (the output signal of the temperature sensor 100)" according to the invention. Further, the digital signal output by the A/D conversion circuit 50 corresponds to a "second digital signal obtained by digitalizing the second analog signal (the output signal of the temperature compensation circuit 30)" according to the invention. Further, the oscillator 1 includes at least the temperature sensor 100 (the detection signal output section) and the temperature compensation circuit 30 (the control section) provided to the package 4 as the substrate, and is capable of outputting the digital signal (the first digital signal) output by the A/D conversion circuit 40 and the digital signal (the second digital signal) output by the A/D conversion circuit 50 from the external terminals 6 of the package 4 via the interface circuit 70.

Method of Manufacturing Oscillator

Figure 6:
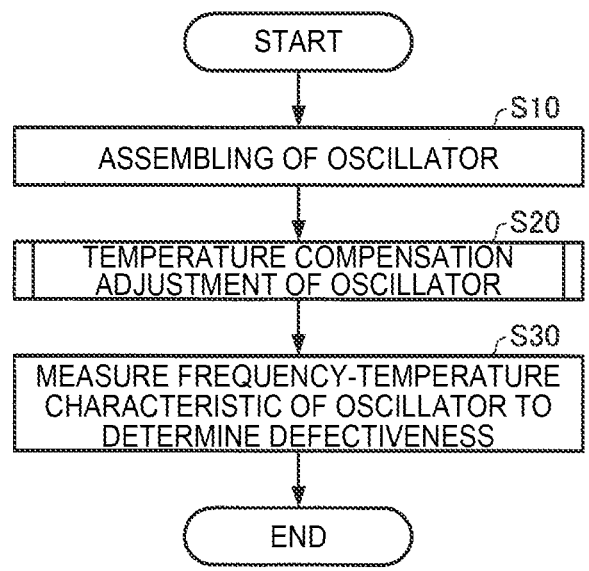
FIG. 6 is a flowchart showing an example of a procedure of a method of manufacturing the oscillator according to the first and second embodiments.

FIG. 6 is a flowchart showing an example of a procedure of a method of manufacturing the oscillator 1 according to the first embodiment. It is also possible to eliminate or modify a part of the processes S10 through S30 shown in FIG. 6, or add other processes.

In the example shown in FIG. 6, firstly, by mounting the integrated circuit (IC) 2 and the vibrator 3 to the package 4 and sealing the package 4 with the lid 5 by performing a thermal treatment, the oscillator 1 is assembled (S10). By the process S10, the integrated circuit (IC) 2 and the vibrator 3 are connected to each other with the wiring disposed on the surfaces of the inside or the recessed part of the package 4, to achieve the state in which the integrated circuit (IC) 2 and the vibrator 3 are electrically connected to each other when supplying the integrated circuit (IC) 2 with the electrical power.

Then, the temperature compensation adjustment of the oscillator 1 is performed (S20). The details of the temperature compensation adjustment process S20 will be described later.

Finally, the frequency-temperature characteristic of the oscillator 1 is measured to determine (S30) whether or not the oscillator 1 is defective. In the process S30, the frequency of the oscillator 1 is measured while gradually changing the ambient temperature of the oscillator 1 to evaluate whether the frequency deviation is within a predetermined range in a desired temperature range (e.g., no lower than −40° C. and no higher than 85° C.), and if the frequency deviation is within the predetermined range, it is determined that the oscillator 1 is a non-defective product, or if the frequency deviation is not within the predetermined range, it is determined that the oscillator 1 is a defective product.

Figure 7:
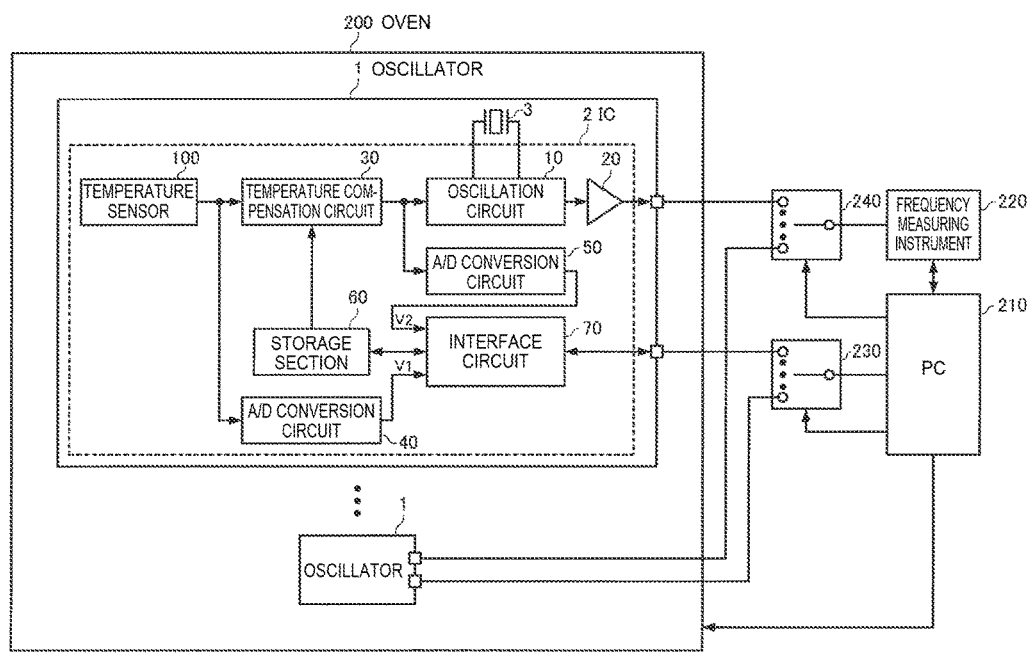
FIG. 7 is a diagram showing an example of a system configuration for performing a temperature compensation adjustment process in the first embodiment.

FIG. 7 is a diagram showing an example of a system configuration for performing the temperature compensation adjustment process (S20 in FIG. 6) in the first embodiment. In the example shown in FIG. 7, a board not shown on which a plurality of the oscillators 1 is mounted is housed inside an oven 200, and a personal computer (PC) 210 is arranged to be able to arbitrarily set the temperature (internal temperature) of the oven 200.

Further, the personal computer (PC) 210 is arranged to be able to control a switching circuit 230 to be connected to either one of the oscillators 1 to perform writing of the temperature compensation data to the storage section 60 via the interface circuit 70 of the oscillator 1 thus connected and reading of the output signal V1 of the A/D conversion circuit 40 and the output signal V2 of the A/D conversion circuit 50.

Further, it is arranged that the personal computer (PC) 210 controls a switching circuit 240 to connect either one of the oscillators 1 to a frequency measuring instrument 220, and the frequency measuring instrument 220 is capable of measuring the frequency of the frequency signal (the oscillation signal) output from the output circuit 20 of the oscillator 1 thus selected.

Figure 8:
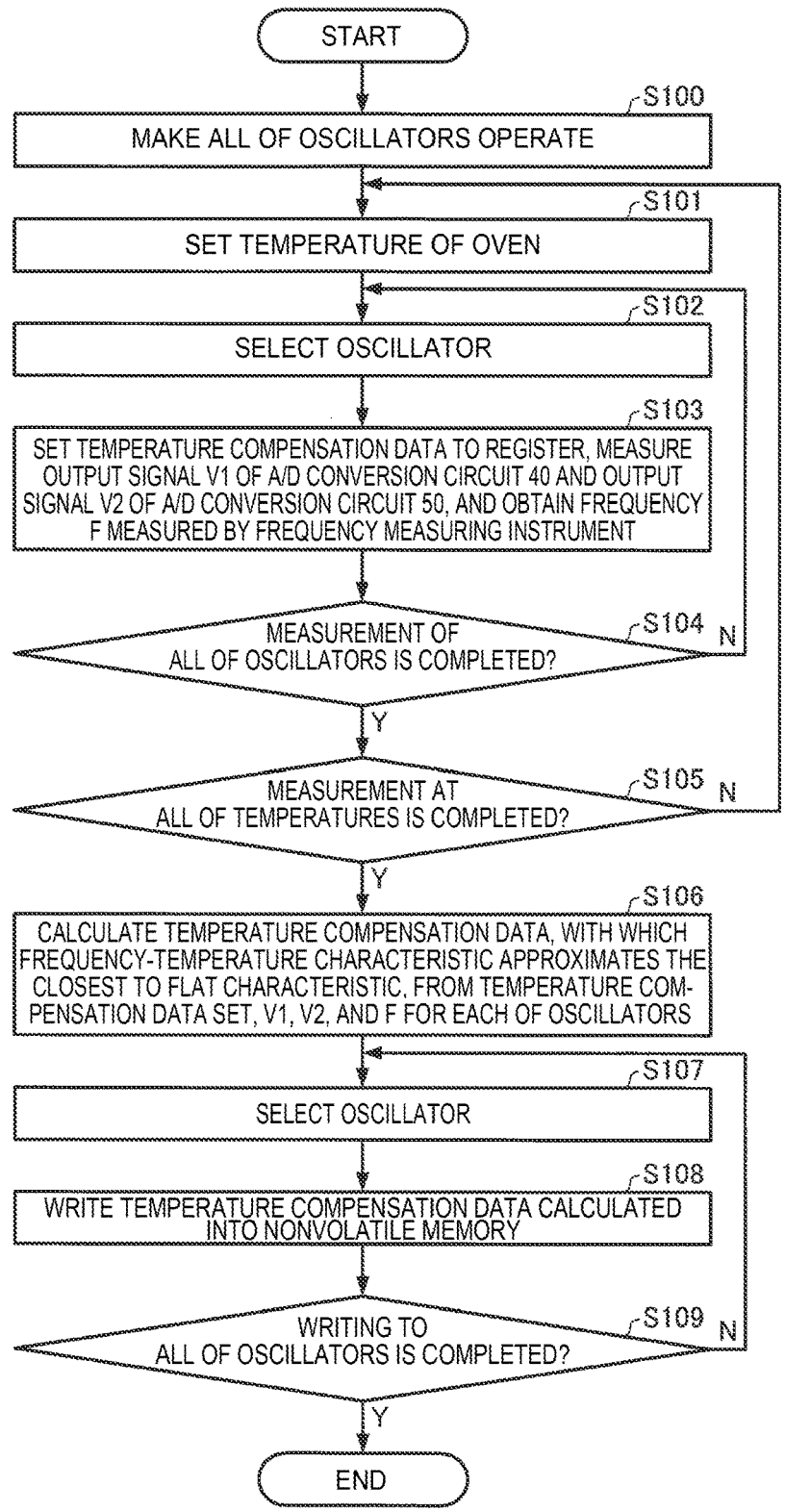
FIG. 8 is a flowchart showing an example of a detailed procedure of the temperature compensation adjustment process in the first embodiment.

FIG. 8 is a flowchart showing an example of a detailed procedure of the temperature compensation adjustment process (S20 in FIG. 6) in the first embodiment, and the procedure shown in FIG. 8 is performed by the system shown in FIG. 7. It is also possible to eliminate or modify a part of the processes S100 through S109 shown in FIG. 8, or add other processes. Further, it is possible to arbitrarily change the order of the processes to the extent possible.

In the example shown in FIG. 8, firstly, the plurality of oscillators 1 mounted on the board is supplied with the power supply voltage to make all of the oscillators 1 operate (S100).

Then, the personal computer (PC) 210 sets (S101) the temperature (the temperature of the plurality of oscillators 1) of the oven to a desired temperature (e.g., −40° C.)

Then, the personal computer (PC) 210 controls the switching circuit 230 and the switching circuit 240 to select one of the oscillators 1 to connect (S102) the selected one of the oscillators 1 to the personal computer (PC) 210 and the frequency measuring instrument 220.

Then, in the state of making the plurality of oscillators 1 operate, the personal computer (PC) 210 sets the predetermined temperature compensation data to the register 64 of the oscillator 1 thus connected via the interface circuit 70, and reads out the output signal (the digital signal obtained by converting the output signal of the temperature sensor 100) V1 of the A/D conversion circuit 40 and the output signal (the digital signal obtained by converting the output signal of the temperature compensation circuit 30) V2 of the A/D conversion circuit 50 to perform the measurement, and then obtains (S103) the frequency F of the output signal of the output circuit 20 measured by the frequency measuring instrument 220. In the process S103, the personal computer (PC) 210 sets a plurality of different temperature compensation data in sequence to the register 64, and obtains the output signals V1, V2 and the frequency F corresponding to each of the temperature compensation data.

The selection (S102) of the oscillator 1 and the measurement in the process S103 are repeated until the personal computer (PC) 210 completes the measurement of all of the oscillators 1 at the temperature set in the process S101 (N in S104).

Then, when the personal computer (PC) 210 completes the measurement of all of the oscillators 1 (Y in S104), the personal computer (PC) 210 subsequently sets (S101) the temperature (the temperature of the plurality of oscillators 1) of the oven to a different temperature (e.g., −30° C.) and then performs the processing of the process S102 through the process S104 again.

Similarly, the processing of the process S101 through the process S104 is repeated until the personal computer (PC) 210 completes the measurement at all of the measurement target temperatures included in the desired temperature range (e.g., −40° C. through +85° C.) in which the operation of the oscillator 1 is guaranteed (N in S105).

Then, when the personal computer (PC) 210 completes the measurement at all of the measurement target temperatures (Y in S105), then the temperature compensation data, with which the frequency-temperature characteristic approximates the closest to a flat characteristic, is calculated (S106) from the temperature compensation data set in the process S103, the output signals V1, V2 measured in the process S103, and the frequency F obtained in the process S103 with respect to each of the oscillators 1. For example, the personal computer (PC) 210 calculates a relationship between the temperature compensation data thus set and the output signal V2, a relationship between the output signal V2 and the frequency F, and so on for each of the output signals V1 with respect to each of the oscillators 1, and then calculates the optimum temperature compensation data based on these relationships.

Then, the personal computer (PC) 210 controls the switching circuit 230 to select and then connect (S107) either one of the oscillators 1, and then writes (S108) the temperature compensation data calculated in the process S106 to the nonvolatile memory 62 of the oscillator 1 thus connected.

Until the personal computer (PC) 210 completes the writing of the temperature compensation data to all of the oscillators 1 (N in S109), the selection (S107) of the oscillator 1 and the writing (S108) of the temperature compensation data are repeated.

Then, when the personal computer (PC) 210 completes the writing of the temperature compensation data to all of the oscillators 1 (Y in S109), the temperature compensation adjustment process is completed.

Advantages

As described hereinabove, the oscillator 1 according to the first embodiment is configured so that the digital signal V1 obtained by digitalizing the output signal of the temperature sensor 100 by the A/D conversion circuit 40, and the digital signal V2 obtained by digitalizing the output signal of the temperature compensation circuit 30 by the A/D conversion circuit 50 can be output to the outside via the interface circuit 70. Further, since the digital signal V1 and the digital signal V2 are difficult to be deteriorated in accuracy by the noise, the personal computer (PC) 210 can perform the temperature compensation adjustment of the oscillator 1 with high accuracy based on the digital signal V1 and the digital signal V2 even in the environment in which the noise is easily generated due to the operation of the plurality of oscillators 1. Therefore, according to the first embodiment, by reducing the error in the temperature compensation adjustment, it is possible to improve the accuracy of the voltage control of the variable capacitance circuit 11 provided to the oscillation circuit 10 to thereby realize the oscillator 1 capable of operating with high frequency accuracy. Further, the yield can be improved.

1-2. Second Embodiment

Configuration of Oscillator

Figure 9:
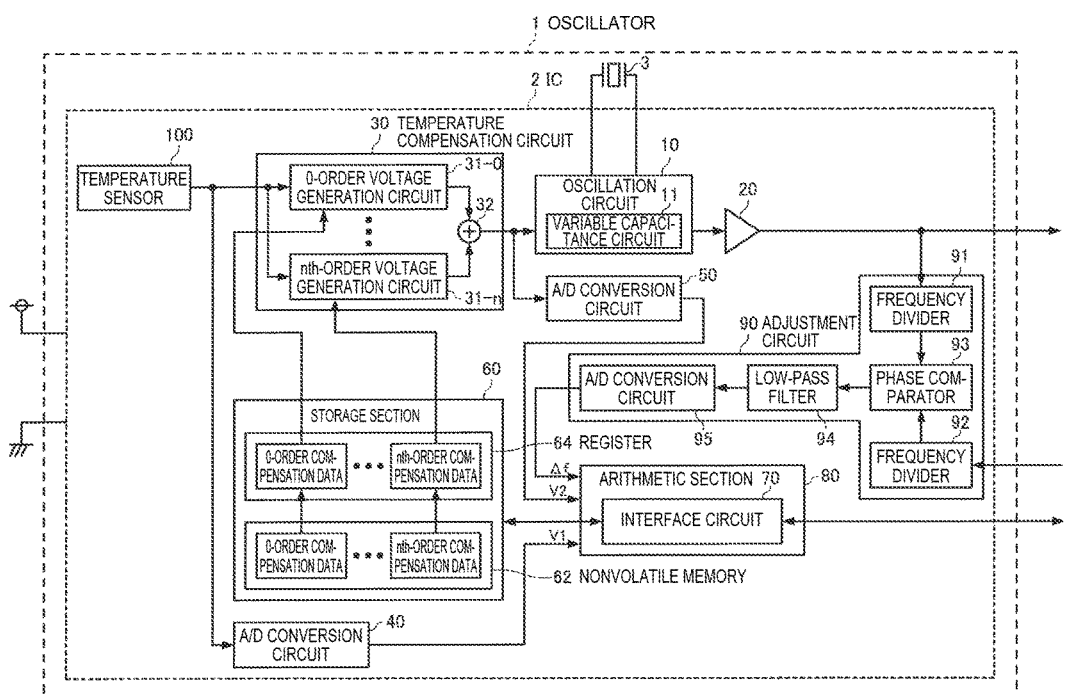
FIG. 9 is a functional block diagram of an oscillator according to a second embodiment of the invention.

Since the structure of an oscillator according to a second embodiment can substantially be the same as shown in FIG. 1, the illustration and the explanation thereof will be omitted. FIG. 9 is a functional block diagram of the oscillator according to the second embodiment. In FIG. 9, the constituents substantially the same as those in FIG. 2 are denoted by the same reference symbols, and the second embodiment will hereinafter be described with a focus on different contents from the first embodiment, and the description redundant to the first embodiment will be omitted.

In the second embodiment, similarly to the first embodiment, the integrated circuit (IC) 2 is configured including the oscillation circuit 10, the output circuit 20, the temperature compensation circuit 30, the A/D conversion circuit 40, the A/D conversion circuit 50, the storage section 60, the interface circuit 70, and the temperature sensor 100, and further including an arithmetic section 80 and an adjustment circuit 90. It should be noted that the integrated circuit (IC) 2 can have a configuration obtained by eliminating or modifying some of these constituents, or adding other constituents. Further, in the present embodiment, the oscillation circuit 10, the output circuit 20, the temperature compensation circuit 30, the A/D conversion circuit 40, the A/D conversion circuit 50, the storage section 60, the interface circuit 70, the arithmetic section 80, the adjustment circuit 90, and the temperature sensor 100 are configured as a single integrated circuit (IC), but can also be constituted by two or more integrated circuits (IC). Further, at least a part of the oscillation circuit 10, the output circuit 20, the temperature compensation circuit 30, the A/D conversion circuit 40, the A/D conversion circuit 50, the storage section 60, the interface circuit 70, the arithmetic section 80, the adjustment circuit 90, and the temperature sensor 100 is not required to be integrated, and can discretely be configured using, for example, a plurality of electronic components.

The adjustment circuit 90 is configured including a frequency divider 91, a frequency divider 92, a phase comparator 93, low-pass filter 94, and an A/D conversion circuit 95. It should be noted that the adjustment circuit can have a configuration obtained by eliminating or modifying some of these constituents, or adding other constituents.

The frequency divider 91 divides the frequency of the frequency signal (the oscillation signal) output by the output circuit 20 to generate a frequency-divided signal. The division ratio of the frequency divider 91 can be fixed, or can also be variable due to the setting of the register 64 or the like.

The frequency divider 92 divides the frequency of a reference signal input from the outside via the external terminals 6 and having a predetermined frequency to generate a frequency-divided signal having the same frequency as the frequency-divided signal output by the frequency divider 91. The division ratio of the frequency divider 92 can be fixed, or can also be variable due to the setting of the register 64 or the like.

The phase comparator 93 compares the phase of the frequency-divided signal output by the frequency divider 91 and the phase of the frequency-divided signal output by the frequency divider 92 with each other to output a signal corresponding to the comparison result. In the present embodiment, it is configured that the frequency difference between the frequency-divided signal output by the frequency divider 91 and the frequency-divided signal output by the frequency divider 92 becomes 0 in the case in which the frequency of the frequency signal (the oscillation signal) output by the output circuit 20 accurately coincides with the desired frequency (a target frequency), and the phase comparator 93 detects the phase difference corresponding to the frequency difference.

The low-pass filter 94 performs the processing of removing (attenuating, to be precise) a high-frequency component from the output signal of the phase comparator 93, and then integrating the result. The cut-off frequency of the low-pass filter 94 can be fixed, or can also be variable due to the setting of the register 64 or the like. The output signal of the low-pass filter 94 has a voltage corresponding to the frequency difference between the frequency-divided signal output by the frequency divider 91 and the frequency-divided signal output by the frequency divider 92.

The A/D conversion circuit 95 converts the output signal of the low-pass filter 94 having the voltage corresponding to the frequency difference into a digital signal $\Delta f$, and then outputs the digital signal $\Delta f$.

The arithmetic section 80 includes the interface circuit 70, and when the arithmetic section 80 is set to a temperature compensation adjustment mode based on a signal input from the external terminals 6 via the interface circuit 70, the arithmetic section 80 makes the A/D conversion circuit 40, the A/D conversion circuit 50, and the adjustment circuit 90 operate.

Further, when the arithmetic section 80 receives a measurement command from the external terminals 6 via the interface circuit 70 in the temperature compensation adjustment mode, the arithmetic section 80 sets the predetermined temperature compensation data (the 0-order compensation data through the $n^{th}$-order compensation data) to the register 64, and measures the digital signal V1 output by the A/D conversion circuit 40, the digital signal V2 output by the A/D conversion circuit 50, and the digital signal $\Delta f$ output by the A/D conversion circuit 95.

Further, when the arithmetic section 80 receives a calculation command from the external terminals 6 via the interface circuit 70 in the temperature compensation adjustment mode, the arithmetic section 80 determines (calculates) the optimum temperature compensation data (an example of the operation condition) based on the measurement result of the digital signals V1, V2, and Δf, and then writes the optimum temperature compensation data into the nonvolatile memory 62.

The arithmetic section 80 can be realized by a general-purpose circuit such as a microcontroller or a microprocessor operating with a program, or can also be a dedicated circuit operating with a sequencer.

It should be noted that similarly to the first embodiment, it is also possible to adopt a configuration in which reading from and writing to the nonvolatile memory 62 or the register 64 can be performed from the external terminals 6 via the interface circuit 70. In this case, it is also possible to arrange that, for example, the arithmetic section 80 writes the temperature compensation data thus calculated into the register 64, and the external device reads out the temperature compensation data stored in the register 64 from the external terminal 6, and then writes the temperature compensation data into the nonvolatile memory 62.

The rest of the configuration and the function of the oscillator 1 according to the second embodiment are substantially the same as those of the first embodiment.

The oscillator 1 according to the second embodiment configured in such a manner as described above functions as the temperature compensated oscillator similarly to the first embodiment. Further, the oscillator 1 according to the second embodiment automatically performs the temperature compensation adjustment when being set to the temperature compensation adjustment mode.

Method of Manufacturing Oscillator

Since the procedure of the method of manufacturing the oscillator 1 according to the second embodiment is substantially the same as shown in FIG. 6, the illustration and the explanation thereof will be omitted. It should be noted that the detailed procedure of the temperature compensation adjustment process (S20 shown in FIG. 6) is different from that of the first embodiment, and will therefore be described below.

Figure 10:
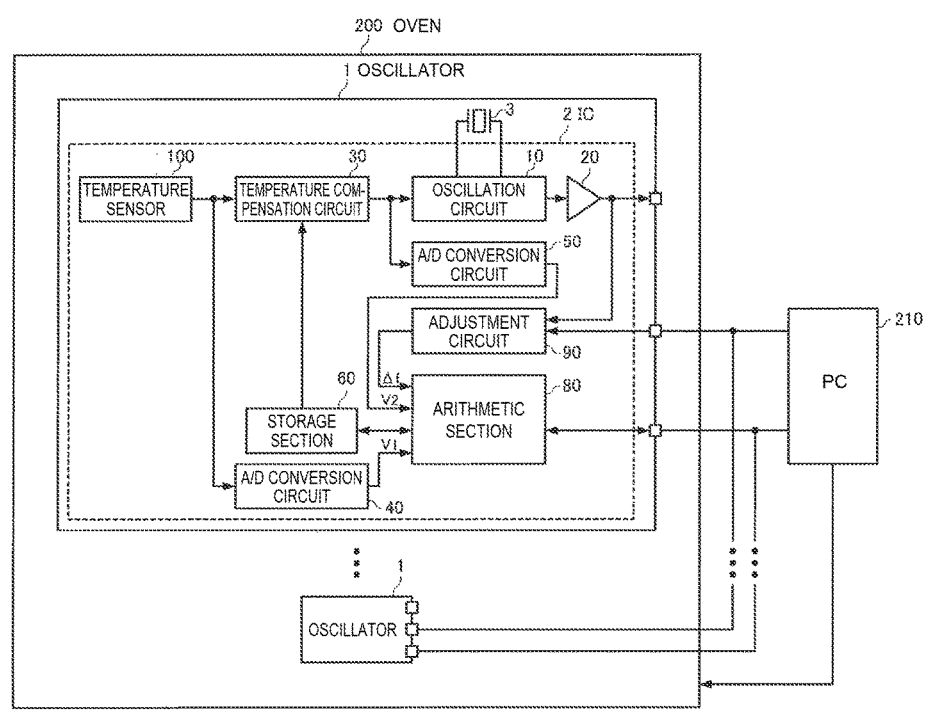
FIG. 10 is a diagram showing an example of a system configuration for performing a temperature compensation adjustment process in the second embodiment.

FIG. 10 is a diagram showing an example of a system configuration for performing the temperature compensation adjustment process (S20 in FIG. 6) in the second embodiment. In FIG. 10, the same constituents as those shown in FIG. 7 are denoted by the same symbols.

Similarly to the example shown in FIG. 7, in the example shown in FIG. 10, a board not shown on which the plurality of the oscillators 1 is mounted is housed inside the oven 200, and the personal computer (PC) 210 is arranged to be able to arbitrarily set the temperature (internal temperature) of the oven 200.

The personal computer (PC) 210 is always connected to all of the oscillators 1 mounted on the board. Further, the personal computer (PC) 210 is arranged to be able to commonly (at the same time) input the reference signal having a predetermined frequency to the frequency divider 92 (see FIG. 9) of the adjustment circuit 90 with respect to each of the oscillators 1. Further, the personal computer (PC) 210 is arranged to be able to commonly (at the same time) input a signal for setting the arithmetic section 80 to the temperature compensation adjustment mode, the measurement command, and the calculation command with respect to each of the oscillators 1.

Figure 11:
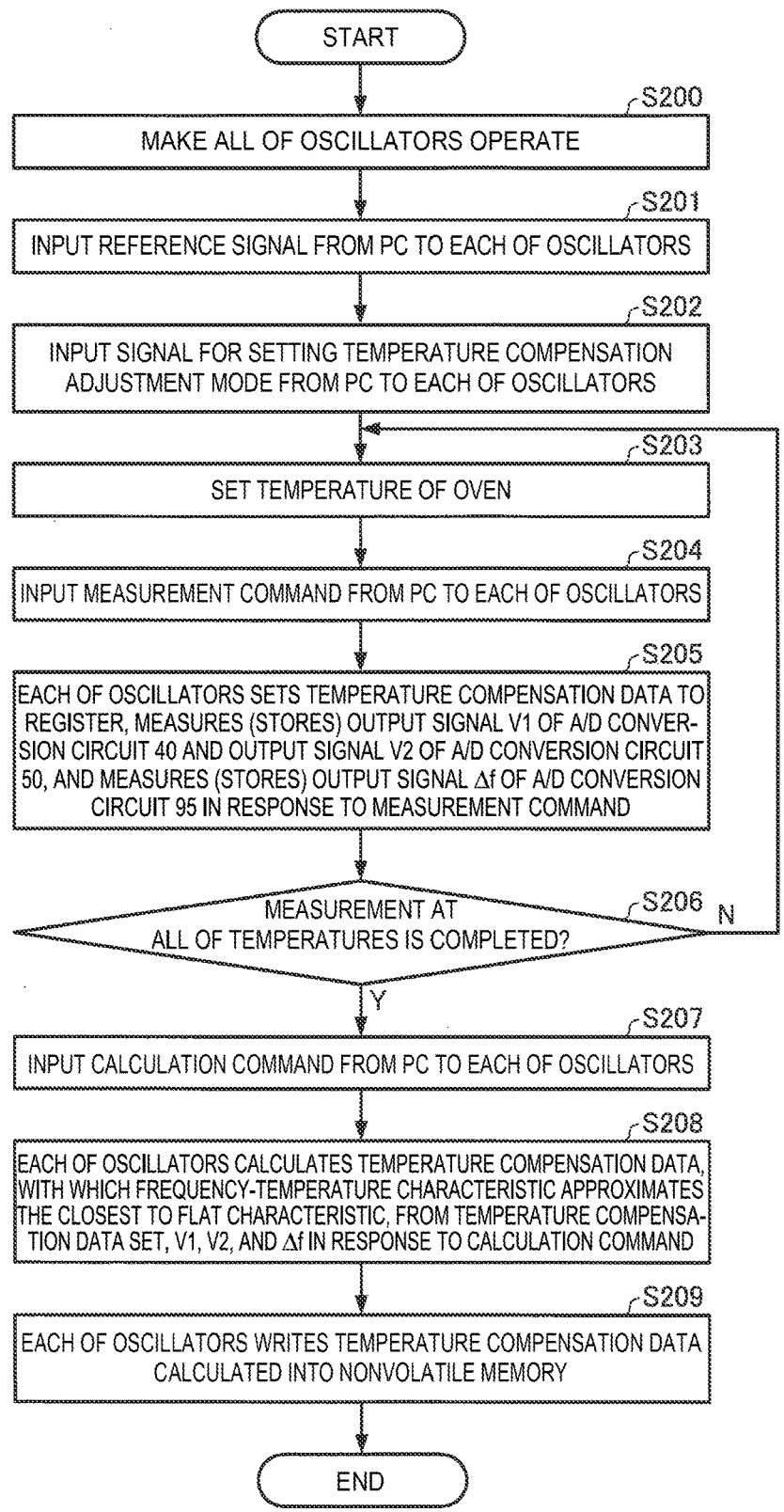
FIG. 11 is a flowchart showing an example of a detailed procedure of the temperature compensation adjustment process in the second embodiment.

FIG. 11 is a flowchart showing an example of a detailed procedure of the temperature compensation adjustment process (S20 in FIG. 6) in the second embodiment, and the procedure shown in FIG. 11 is performed by the system shown in FIG. 10. It is also possible to eliminate or modify a part of the processes S200 through S209 shown in FIG. 11, or add other processes. Further, it is possible to arbitrarily change the order of the processes to the extent possible.

In the example shown in FIG. 11, firstly, the plurality of oscillators 1 mounted on the board is supplied with the power supply voltage to make all of the oscillators 1 operate (S200).

Then, the personal computer (PC) 210 inputs (S201) the reference signal with the predetermined frequency to each of the oscillators 1.

Then, the personal computer (PC) 210 inputs (S202) the signal for setting the temperature compensation adjustment mode to each of the oscillators 1.

Then, the personal computer (PC) 210 sets (S203) the temperature (the temperature of the plurality of oscillators 1) of the oven to a desired temperature (e.g., −40° C.)

Then, the personal computer (PC) 210 inputs (S204) the measurement command to each of the oscillators 1.

Then, in response to the measurement command, each of the oscillators 1 sets the predetermined temperature compensation data to the register 64, measures (stores) the output signal (the digital signal obtained by converting the output signal of the temperature sensor 100) V1 of the A/D conversion circuit 40 and the output signal (the digital signal obtained by converting the output signal of the temperature compensation circuit 30) V2 of the A/D conversion circuit 50, and measures (stores) the output signal Δf of the A/D conversion circuit 95 (S205). In the process S205, each of the oscillators 1 sets the plurality of different temperature compensation data in sequence to the register 64, and obtains the output signals V1, V2, and Δf corresponding to each of the temperature compensation data.

Then, the personal computer (PC) 210 sets (S203) the temperature (the temperature of the plurality of oscillators 1) of the oven to a different temperature (e.g., −30° C.), and then performs the processing of the process S204 and the process S205 again.

Similarly, the processing of the process S203 through the process S205 is repeated until the personal computer (PC) 210 completes the measurement at all of the measurement target temperatures included in the desired temperature range (e.g., −40° C. through +85° C.) in which the operation of the oscillator 1 is guaranteed (N in S206).

Then, when the personal computer (PC) 210 completes the measurement by the oscillators 1 at all of the measurement target temperatures (Y in S206), then the personal computer (PC) 210 inputs (S207) the calculation command to each of the oscillators 1.

Then, in response to the calculation command, each of the oscillators 1 calculates (determines) (S208) the temperature compensation data, with which the frequency-temperature characteristic approximates the closest to a flat characteristic, from the temperature compensation data set in the process S205, the output signals V1, V2 measured in the process S205, and the output signal Δf measured in the process S205. For example, each of the oscillators 1 calculates a relationship between the temperature compensation data thus set and the output signal V2, a relationship between the output signal V2 and the frequency F, and so on for each of the output signals V1, and then calculates the optimum temperature compensation data based on these relationships.

Then, each of the oscillators 1 writes (S209) the temperature compensation data calculated in the step S208 into the nonvolatile memory 62, and the temperature compensation adjustment process is completed.

Advantages

As described hereinabove, the oscillator 1 according to the second embodiment is configured so that the arithmetic section 80 can measure the digital signal V1 obtained by digitalizing the output signal of the temperature sensor 100 by the A/D conversion circuit 40, and the digital signal V2 obtained by digitalizing the output signal of the temperature compensation circuit 30 by the A/D conversion circuit 50. Further, since the digital signal V1 and the digital signal V2 are difficult to be deteriorated in accuracy by the noise, the arithmetic section 80 of each of the oscillators 1 can perform the temperature compensation adjustment with high accuracy based on the measurement result of the digital signal V1 and the digital signal V2 even in the environment in which the noise is easily generated due to the operation of the plurality of oscillators 1. Therefore, according to the second embodiment, by reducing the error in the temperature compensation adjustment, it is possible to improve the accuracy of the voltage control of the variable capacitance circuit 11 provided to the oscillation circuit 10 to thereby realize the oscillator 1 capable of operating with high frequency accuracy. Further, the yield can be improved.

Further, according to the second embodiment, since the plurality of oscillators 1 can perform the temperature compensation adjustment at the same time, the time necessary for the adjustment of the plurality of oscillators 1 can dramatically be reduced.

1-3. Third Embodiment

Configuration of Oscillator

Figure 12:
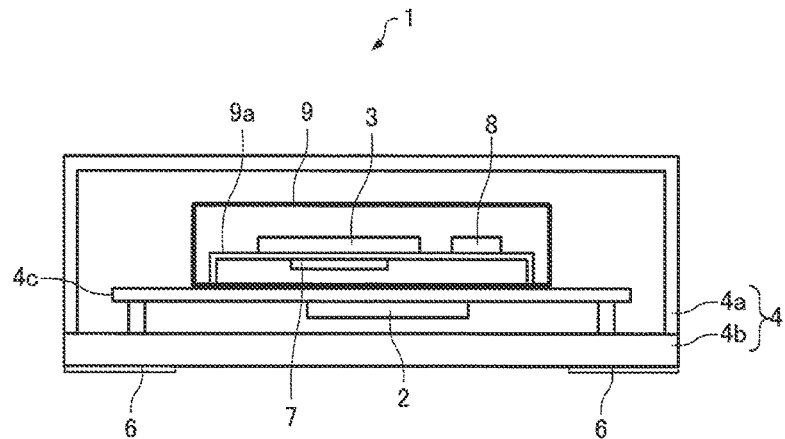
FIG. 12 is a diagram showing an example of a structure of an oscillator according to third and fourth embodiments of the invention.

FIG. 12 is a diagram showing an example of a structure of an oscillator according to a third embodiment, and is a cross-sectional view of the oscillator. As shown in FIG. 12, the oscillator 1 according to the third embodiment is configured including the integrated circuit (IC) 2, the vibrator 3, the package 4, external terminals (external electrodes) 6, a heat generating element 7, and a temperature sensor 8.

The package 4 is constituted by a case 4a and a base 4b bonded to each other.

In the internal space of the package 4, there is disposed a component mounting board 4c so as to be opposed to the base 4b, and an oven 9 is mounted on the upper surface of the component mounting board 4c. Further, on a lower surface of the component mounting board 4c, there is mounted the integrated circuit (IC) 2.

The vibrator 3 and the temperature sensor 8 are mounted on an upper surface of a component mounting board 9a, and the heat generating element 7 is mounted at the position opposed to the vibrator 3 on the lower surface of the component mounting board 9a to thereby be housed in the internal space of the package 4.

Terminals of the vibrator 3, the heat generating element 7, and the temperature sensor 8 are electrically connected respectively to the desired terminals of the integrated circuit (IC) 2 with a wiring pattern not shown. Further, some of the terminals of the integrated circuit (IC) 2 are electrically connected to the external terminals 6 disposed on a surface of the package 4 with a wiring pattern not shown.

The vibrator 3 is formed of a vibrator element not shown encapsulated in a package having high airtightness. The vibrator element has metal excitation electrodes respectively disposed on the obverse surface and the reverse surface of the vibrator element, and the vibrator 3 oscillates with a desired frequency corresponding to the mass of the vibrator element including the excitation electrodes.

As the vibrator 3, there can be used, for example, a quartz crystal vibrator, a surface acoustic wave (SAW) resonator, other piezoelectric vibrators, and an MEMS (Micro Electro Mechanical Systems) vibrator. As a substrate material of the vibrator 3, there can be used a piezoelectric material such as a piezoelectric single crystal such as a quartz crystal, lithium tantalate, or lithium niobate, or piezoelectric ceramics such as lead zirconate titanate, a silicon semiconductor material, or the like. As an excitation device of the vibrator 3, there can be used a device using a piezoelectric effect, or electrostatic drive using a coulomb force.

The head generating element 7 is, for example, an element for generating heat in response to a current flowing therethrough, and can be a resistor, a power transistor, a Peltier element, or the like.

The temperature sensor 8 outputs a signal (e.g., a voltage corresponding to the temperature) corresponding to the ambient temperature of the temperature sensor 8. The temperature sensor 8 can also be, for example, a thermistor, a platinum resistance, or a temperature detection circuit using the bandgap of a semiconductor.

Figure 13:
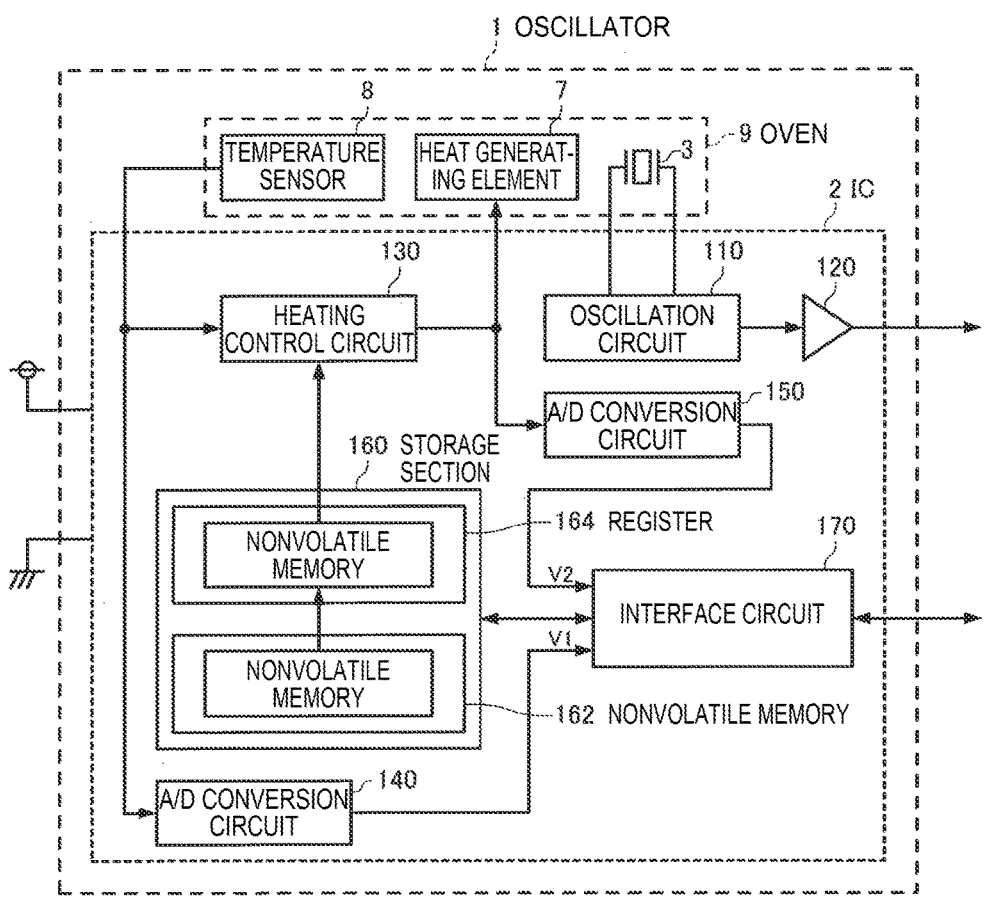
FIG. 13 is a functional block diagram of the oscillator according to the third embodiment.

FIG. 13 is a functional block diagram of the oscillator 1 according to the third embodiment. As shown in FIG. 13, the oscillator 1 according to the third embodiment includes the vibrator 3, the heat generating element 7, and the temperature sensor 8 housed in the oven 9, and the integrated circuit (IC) 2 for oscillating the vibrator 3, and the integrated circuit (IC) 2, the vibrator 3, the heat generating element 7, and the temperature sensor 8 are housed in the package 4.

In the present embodiment, the integrated circuit (IC) 2 is configured including an oscillation circuit 110, an output circuit 120, a heating control circuit 130, an A/D conversion circuit 140, an A/D conversion circuit 150, a storage section 160, and an interface circuit 170. It should be noted that the integrated circuit (IC) 2 can have a configuration obtained by eliminating or modifying some of these constituents, or adding other constituents. Further, in the present embodiment, the oscillation circuit 110, the output circuit 120, the heating control circuit 130, the A/D conversion circuit 140, the A/D conversion circuit 150, the storage section 160, and the interface circuit 170 are configured as a single integrated circuit (IC), but can also be constituted by two or more integrated circuits (IC). Further, at least a part of the oscillation circuit 110, the output circuit 120, the heating control circuit 130, the A/D conversion circuit 140, the A/D conversion circuit 150, the storage section 160, and the interface circuit 170 is not required to be integrated, and can discretely be configured using, for example, a plurality of electronic components.

The storage section 160 has a nonvolatile memory 162 and a register 164, and is configured so that reading from and writing to the nonvolatile memory 162 or the register 164 can be performed from the external terminals 6 via the interface circuit 170. The interface circuit 170 can be an interface circuit compatible with a variety of types of serial bus such as SPI or I²C, or can also be an interface circuit compatible with a parallel bus. It should be noted that in order to reduce the number of the external terminals of the oscillator 1 to miniaturize the package 4, it is desirable to configure the interface circuit 170 as an interface circuit compatible with the serial bus.

The nonvolatile memory 162 is a storage section for storing a variety of types of control data, and is configured as a programmable ROM (PROM) to which data can be written. The nonvolatile memory 162 can be a variety of types of rewritable memory such as an EEPROM, or can also be a variety of types of non-rewritable (writable only once) memory such as a one-time PROM.

The nonvolatile memory 162 stores temperature control data for controlling the heating control circuit 130. The temperature control data is, for example, the data for setting the internal temperature (the temperature of the vibrator 3) of the oven 9, and can also be the data of a threshold voltage to be compared with the output voltage of the temperature sensor 8 in order to control the heat generation of the heat generating element 7. If the vibrator 3 is an SC-cut quartz crystal vibrator, the frequency-temperature characteristic exhibits a quadratic curve, and the frequency variation per unit temperature is the smallest in the vicinity of the peak of the quadratic curve. Therefore, for example, the temperature control data can also be the data for setting the internal temperature of the oven 9 so that the temperature of the vibrator 3 becomes the temperature in the vicinity of the peak. It should be noted that the nonvolatile memory 162 can also store control data for the oscillation circuit 110 and the output circuit 120.

Each of the data stored in the nonvolatile memory 162 is transferred from the nonvolatile memory 162 to the register 164, when powering on (when the voltage between the power terminals rises from 0 V to a desired voltage) the integrated circuit (IC) 2, and is then held in the register 164. Thus, the temperature control data held in the register 164 is input to the heating control circuit 130.

In the case in which the nonvolatile memory 162 is non-rewritable (writable only once), in the manufacturing process (an inspection process) of the oscillator 1, each of the data is directly written into the register 164 from the external terminals 6 via the interface circuit 170 to be adjusted/selected so that the oscillator 1 fulfills the desired characteristic, and then each of the data thus adjusted/selected is finally written into the nonvolatile memory 162. In the case in which the nonvolatile memory 162 is rewritable, it is also possible to arrange that each of the data is written into the nonvolatile memory 162 from the external terminals 6 via the interface circuit 170 in the manufacturing process (the inspection process) of the oscillator 1. It should be noted that since writing to the nonvolatile memory 162 generally takes time, in order to shorten the inspection time of the oscillator 1, it is also possible to arrange that each of the data is directly written into the register 164 from the external terminals 6 via the interface circuit 170, and each of the data adjusted/selected is finally written into the nonvolatile memory 162.

The oscillation circuit 110 amplifies the output signal of the vibrator 3 to feedback the result to the vibrator 3 to thereby oscillate the vibrator 3, and then outputs a frequency signal (an oscillation signal) based on the oscillation of the vibrator 3.

As the oscillation circuit 110, there can be adopted a circuit having a known variety of types of configurations, and the circuit constituted by the oscillation circuit 110 and the vibrator 3 can also be a variety of types of oscillation circuit such as a pierce oscillator circuit, an inverter type oscillation circuit, a Colpitts oscillator circuit, or a Hartley oscillator circuit. For example, the oscillation stage current of the oscillation circuit 110 can be controlled by the control data held in the register 164.

The frequency signal (the oscillation signal) output by the oscillation circuit 110 is input to the output circuit 120, and the output circuit 120 generates a frequency signal (an oscillation signal) for an external output, and then outputs the frequency signal to the outside via the external terminals 6. The output circuit 120 can be a differential output circuit such as an LVDS circuit, a PECL circuit, or an LVPECL circuit, or can also be a single-ended output circuit. Further, it is also possible for the output circuit 120 to divide the frequency of the frequency signal (the oscillation signal) output by the oscillation circuit 110, and then output the oscillation signal thus divided. For example, the division ratio and the output level of the frequency signal (the oscillation signal) in the output circuit 120 can be controlled by the control data held in the register 164.

The heating control circuit 130 is provided with a heating control function as a stabilization function for stabilizing the temperature characteristic of the frequency signal (the oscillation signal) output by the oscillation circuit 10, and the output signal from the temperature sensor 8 is input to the heating control circuit 130, and the heating control circuit 130 generates a heating control signal as the information representing the operation state of the heating control function. The heating control signal is a signal for controlling the heat generation of the heat generating element 7, and the heating control circuit 130 controls the heat generation of the heat generating element 7 so that the output signal of the temperature sensor 8 is kept at the desired voltage value corresponding to the temperature control data held in the register 164. Thus, the internal temperature (the temperature of the vibrator 3) of the oven 9 is controlled so as to be roughly constant irrespective of the ambient temperature of the oscillator 1.

The heat generating element 7 is controlled in the heat generation value based on the heating control signal output by the heating control circuit 130, and functions as a heat generating section for heating the vibrator 3. It is also possible to arrange that, for example, the heat generating element 7 varies in heat generation value in accordance with the amount of the current, and the amount of the current flowing through the heat generating element 7 is controlled based on the heating control signal.

The A/D conversion circuit 140 is a circuit functioning as an analog-to-digital conversion section for converting the output signal (an analog signal as the temperature information) of the temperature sensor 8 into a digital signal. The digital signal converted by the A/D conversion circuit 140 is arranged to be able to be output (retrieved) from the external terminals 6 via the interface circuit 170.

The A/D conversion circuit 150 is a circuit functioning as an analog-to-digital conversion section for converting the heating control signal (an analog signal as the information representing the operation state of the heating control function) output by the heating control circuit 130 into a digital signal. The digital signal converted by the A/D conversion circuit 150 is arranged to be able to be output (retrieved) from the external terminals 6 via the interface circuit 170.

The oscillator 1 according to the third embodiment configured as described above functions as an oven controlled oscillator (oven controlled crystal oscillator (OCXO) if the vibrator 3 is a quartz crystal vibrator) for outputting the frequency signal (the oscillation signal) with a frequency extremely stable irrespective of the temperature in the desired temperature range in which the operation of the oscillator 1 is guaranteed. In particular, by using the SC-cut quartz crystal vibrator as the vibrator 3, and setting the temperature control data so that the temperature of the vibrator 3 becomes the temperature in the vicinity of the peak, it is possible to realize the oven controlled oscillator extremely high in frequency stability.

It should be noted that the oscillator 1 corresponds to an "electronic device" according to the invention. Further, the oscillation circuit constituted by the oscillation circuit 110 and the vibrator 3 corresponds to a "drive section" according to the invention. Further, the temperature sensor corresponds to a "detection signal output section for generating a first analog signal, the value of which varies due to the variation of the physical quantity (the temperature)." Further, the heating control circuit 130 corresponds to a "control section for generating a second analog signal controlled based on the first analog signal (the output signal of the temperature sensor 8), and controlling the drive state of the drive section (the oscillation circuit constituted by the oscillation circuit 110 and the vibrator 3)" according to the invention. Further, the digital signal output by the A/D conversion circuit 140 corresponds to a "first digital signal obtained by digitalizing the first analog signal (the output signal of the temperature sensor 8)" according to the invention. Further, the digital signal output by the A/D conversion circuit 150 corresponds to a "second digital signal obtained by digitalizing the second analog signal (the output signal of the heating control circuit 130)" according to the invention. Further, the oscillator 1 includes at least the temperature sensor 8 (the detection signal output section) and the heating control circuit 130 (the control section) provided to the package 4 as the substrate, and is capable of outputting the digital signal (the first digital signal) output by the A/D conversion circuit 140 and the digital signal (the second digital signal) output by the A/D conversion circuit 150 from the external terminals 6 of the package 4 via the interface circuit 170.

Method of Manufacturing Oscillator

Figure 14:
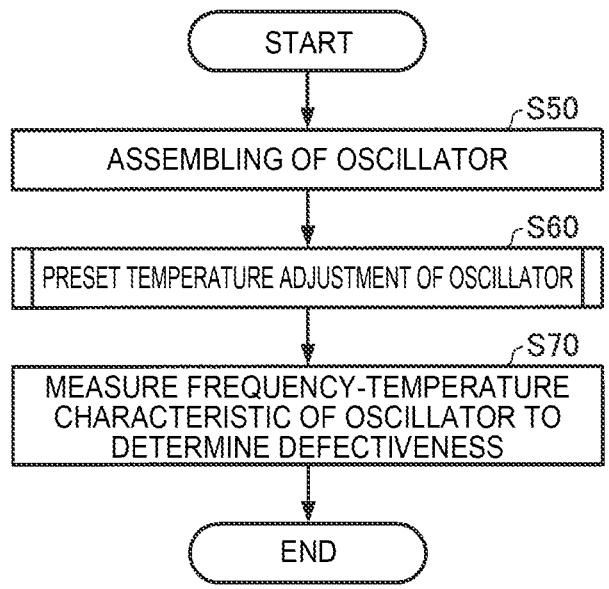
FIG. 14 is a flowchart showing an example of a procedure of a method of manufacturing the oscillator according to the third and fourth embodiments.

FIG. 14 is a flowchart showing an example of a procedure of a method of manufacturing the oscillator 1 according to the third embodiment. It is also possible to eliminate or modify a part of the processes S50 through S70 shown in FIG. 14, or add other processes.

In the example shown in FIG. 14, firstly, by mounting the integrated circuit (IC) 2 and the oven 9 housing the vibrator 3, the heat generating element 7, and the temperature sensor 8 to the base 4*b*, and sealing the case 4*a* and the base 4*b* by performing a thermal treatment, the oscillator 1 is assembled (S50). By the process S50, the integrated circuit (IC) 2, the vibrator 3, the heat generating element 7, and the temperature sensor 8 are connected to each other with the wiring disposed on the surfaces of the inside or the recessed part of the package 4, to achieve the state in which the integrated circuit (IC) 2, the vibrator 3, the heat generating element 7, and the temperature sensor 8 are electrically connected to each other when supplying the integrated circuit (IC) 2 with the electrical power.

Then, a preset temperature adjustment of the oscillator 1 is performed (S60). The details of the preset temperature adjustment process S60 will be described later.

Finally, the frequency-temperature characteristic of the oscillator 1 is measured to determine (S70) whether or not the oscillator 1 is defective. In the process S70, the frequency of the oscillator 1 is measured while gradually changing the ambient temperature of the oscillator 1 to evaluate whether the frequency deviation is within a predetermined range in a desired temperature range (e.g., no lower than −40° C. and no higher than 85° C.), and if the frequency deviation is within the predetermined range, it is determined that the oscillator 1 is a non-defective product, or if the frequency deviation is not within the predetermined range, it is determined that the oscillator 1 is a defective product.

Figure 15:
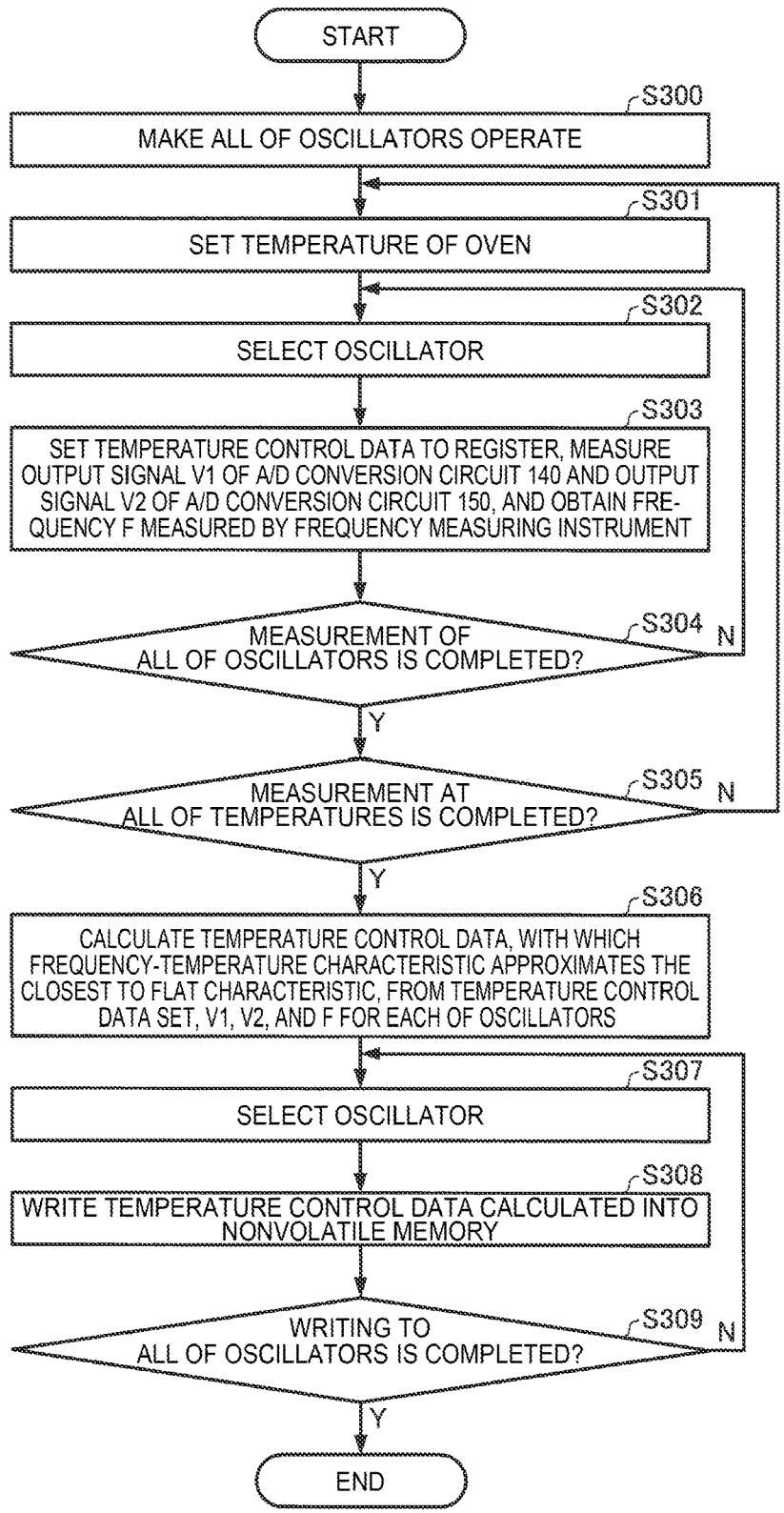
FIG. 15 is a flowchart showing an example of a detailed procedure of a preset temperature adjustment process in the third embodiment.

FIG. 15 is a flowchart showing an example of a detailed procedure of the preset temperature adjustment process (S60 in FIG. 14) in the third embodiment, and the procedure shown in FIG. 15 is performed by a system similar to the system shown in FIG. 7. It is also possible to eliminate or modify a part of the processes S300 through S309 shown in FIG. 15, or add other processes. Further, it is also possible to arbitrarily change the order of the processes to the extent possible.

In the example shown in FIG. 15, firstly, the plurality of oscillators 1 mounted on the board is supplied with the power supply voltage to make all of the oscillators 1 operate (S300).

Then, the personal computer (PC) 210 sets (S301) the temperature (the temperature of the plurality of oscillators 1) of the oven 200 to a desired temperature (e.g., −40° C.)

Then, the personal computer (PC) 210 controls the switching circuit 230 and the switching circuit 240 to select one of the oscillators 1 to connect (S302) the selected one of the oscillators 1 to the personal computer (PC) 210 and the frequency measuring instrument 220.

Then, in the state of making the plurality of oscillators 1 operate, the personal computer (PC) 210 sets the predetermined temperature control data to the register 164 of the oscillator 1 thus connected via the interface circuit 170, and reads out the output signal (the digital signal obtained by converting the output signal of the temperature sensor 8) V1 of the A/D conversion circuit 140 and the output signal (the digital signal obtained by converting the output signal of the heating control circuit 130) V2 of the A/D conversion circuit 150 to perform the measurement, and then obtains (S303) the frequency F of the output signal of the output circuit 120 measured by the frequency measuring instrument 220. In the process S303, the personal computer (PC) 210 sets a plurality of different temperature control data in sequence to the register 164, and obtains the output signals V1, V2 and the frequency F corresponding to each of the temperature control data.

The selection (S302) of the oscillator 1 and the measurement in the process S303 are repeated until the personal computer (PC) 210 completes (N in S304) the measurement of all of the oscillators 1 at the temperature set in the process S301.

Then, when the personal computer (PC) 210 completes the measurement of all of the oscillators 1 (Y in S304), the personal computer (PC) 210 subsequently sets (S301) the temperature (the temperature of the plurality of oscillators 1) of the oven 200 to a different temperature (e.g., −30° C.), and then performs the processing of the process S302 through the process S304 again.

Similarly, the processing of the process S301 through the process S304 is repeated until the personal computer (PC) 210 completes the measurement at all of the measurement target temperatures included in the desired temperature range (e.g., −40° C. through +85° C.) in which the operation of the oscillator 1 is guaranteed (N in S305).

Then, when the personal computer (PC) 210 completes (Y in S305) the measurement at all of the measurement target temperatures, then the temperature control data, with which the frequency-temperature characteristic approximates the closest to a flat characteristic, is calculated (S306) from the temperature control data set in the process S303, the output signals V1, V2 measured in the process S303, and the frequency F obtained in the process S303 with respect to each of the oscillators 1. For example, the personal computer (PC) 210 calculates a relationship between the temperature control data thus set and the output signal V2, a relationship between the output signal V2 and the frequency F, and so on for each of the output signals V1 with respect to each of the oscillators 1, and then calculates the optimum temperature control data based on these relationships.

Then, the personal computer (PC) 210 controls the switching circuit 230 to select and then connect (S307) either one of the oscillators 1, and then writes (S308) the temperature control data calculated in the process S306 to the nonvolatile memory 162 of the oscillator 1 thus connected.

Until the personal computer (PC) 210 completes the writing of the temperature control data to all of the oscillators 1 (N in S309), the selection (S307) of the oscillator 1 and the writing (S308) of the temperature control data are repeated.

Then, when the personal computer (PC) 210 completes (Y in S309) the writing of the temperature control data to all of the oscillators 1, the preset temperature adjustment process is completed.

Advantages

As described hereinabove, the oscillator 1 according to the third embodiment is configured so that the digital signal V1 obtained by digitalizing the output signal of the temperature sensor 8 by the A/D conversion circuit 140, and the digital signal V2 obtained by digitalizing the output signal of the heating control circuit 130 by the A/D conversion circuit 150 can be output to the outside via the interface circuit 170. Further, since the digital signal V1 and the digital signal V2 are difficult to be deteriorated in accuracy by the noise, the personal computer (PC) 210 can perform the preset temperature adjustment of the oscillator 1 with high accuracy based on the digital signal V1 and the digital signal V2 even in the environment in which the noise is easily generated due to the operation of the plurality of oscillators 1. Therefore, according to the third embodiment, by reducing the error in the preset temperature adjustment, it is possible to improve the accuracy of the heating control of the heat generating element 7 to thereby realize the oscillator 1 capable of operating with high frequency accuracy. Further, the yield can be improved.

1-4. Fourth Embodiment

Configuration of Oscillator

Figure 16:
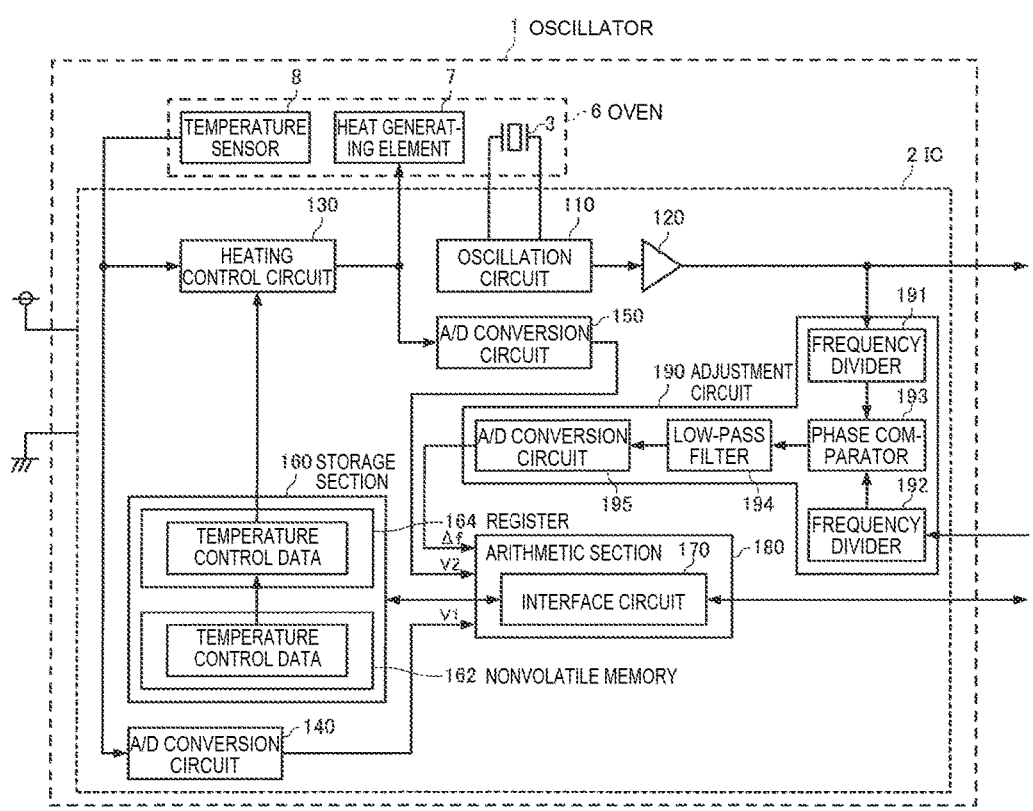
FIG. 16 is a functional block diagram of the oscillator according to the fourth embodiment.

Since the structure of an oscillator according to a fourth embodiment can substantially be the same as shown in FIG. 12, the illustration and the explanation thereof will be omitted. FIG. 16 is a functional block diagram of the oscillator according to the fourth embodiment. In FIG. 16, the constituents substantially the same as those in FIG. 13 are denoted by the same reference symbols, and the fourth embodiment will hereinafter be described with a focus on different contents from the third embodiment, and the description redundant to the third embodiment will be omitted.

In the fourth embodiment, similarly to the third embodiment, the integrated circuit (IC) 2 is configured including the oscillation circuit 110, the output circuit 120, the heating control circuit 130, the A/D conversion circuit 140, the A/D conversion circuit 150, the storage section 160, and the interface circuit 170, and further including an arithmetic section 180 and an adjustment circuit 190. It should be noted that the integrated circuit (IC) 2 can have a configuration obtained by eliminating or modifying some of these constituents, or adding other constituents. Further, in the present embodiment, the oscillation circuit 110, the output circuit 120, the heating control circuit 130, the A/D conversion circuit 140, the A/D conversion circuit 150, the storage section 160, the interface circuit 170, the arithmetic section 180, and the adjustment circuit 190 are configured as a single integrated circuit (IC), but can be constituted by two or more integrated circuits (IC). Further, at least a part of the oscillation circuit 110, the output circuit 120, the heating control circuit 130, the A/D conversion circuit 140, the A/D conversion circuit 150, the storage section 160, the interface circuit 170, the arithmetic section 180, and the adjustment circuit 190 is not required to be integrated, and can discretely be configured using, for example, a plurality of electronic components.

The adjustment circuit 190 is configured including a frequency divider 191, a frequency divider 192, a phase comparator 193, low-pass filter 194, and an A/D conversion circuit 195. It should be noted that the adjustment circuit 190 can have a configuration obtained by eliminating or modifying some of these constituents, or adding other constituents.

The frequency divider 191 divides the frequency of the frequency signal (the oscillation signal) output by the output circuit 120 to generate a frequency-divided signal. The division ratio of the frequency divider 191 can be fixed, or can also be variable due to the setting of the register 164 or the like.

The frequency divider 192 divides the frequency of a reference signal input from the outside via the external terminals 6 and having a predetermined frequency to generate a frequency-divided signal having the same frequency as the frequency-divided signal output by the frequency divider 191. The division ratio of the frequency divider 192 can be fixed, or can also be variable due to the setting of the register 164 or the like.

The phase comparator 193 compares the phase of the frequency-divided signal output by the frequency divider 191 and the phase of the frequency-divided signal output by the frequency divider 192 with each other to output a signal corresponding to the comparison result. In the present embodiment, it is configured that the frequency difference between the frequency-divided signal output by the frequency divider 191 and the frequency-divided signal output by the frequency divider 192 becomes 0 in the case in which the frequency of the frequency signal (the oscillation signal) output by the output circuit 120 accurately coincides with the desired frequency (a target frequency), and the phase comparator 193 detects the phase difference corresponding to the frequency difference.

The low-pass filter 194 performs the processing of removing (attenuating, to be precise) a high-frequency component from the output signal of the phase comparator 193, and then integrating the result. The cut-off frequency of the low-pass filter 194 can be fixed, or can also be variable due to the setting of the register 164 or the like. The output signal of the low-pass filter 194 has a voltage corresponding to the frequency difference between the frequency-divided signal output by the frequency divider 191 and the frequency-divided signal output by the frequency divider 192.

The A/D conversion circuit 195 converts the output signal of the low-pass filter 194 having the voltage corresponding to the frequency into a digital signal $\Delta f$, and then outputs the digital signal $\Delta f$.

The arithmetic section 180 includes the interface circuit 170, and when the arithmetic section 180 is set to a preset temperature adjustment mode based on a signal input from the external terminals 6 via the interface circuit 170, the arithmetic section 180 makes the A/D conversion circuit 140, the A/D conversion circuit 150, and the adjustment circuit 190 operate.

Further, when the arithmetic section 180 receives a measurement command from the external terminals 6 via the interface circuit 170 in the preset temperature adjustment mode, the arithmetic section 180 sets the predetermined heating control data to the register 164, and measures the digital signal V1 output by the A/D conversion circuit 140, the digital signal V2 output by the A/D conversion circuit 150, and the digital signal Δf output by the A/D conversion circuit 195.

Further, when the arithmetic section 180 receives a calculation command from the external terminals 6 via the interface circuit 170 in the preset temperature adjustment mode, the arithmetic section 180 determines (calculates) the optimum temperature control data (an example of the operation condition) based on the measurement result of the digital signals V1, V2, and Δf, and then writes the optimum temperature control data into the nonvolatile memory 162.

The arithmetic section 180 can be realized by a general-purpose circuit such as a microcontroller or a microprocessor operating with a program, or can also be a dedicated circuit operating with a sequencer.

It should be noted that similarly to the third embodiment, it is also possible to adopt a configuration in which reading from and writing to the nonvolatile memory 162 or the register 164 can be performed from the external terminals 6 via the interface circuit 170. In this case, it is also possible to arrange that, for example, the arithmetic section 180 writes the temperature control data thus calculated into the register 164, and the external device reads out the temperature control data stored in the register 164 from the external terminal 6, and then writes the temperature control data into the nonvolatile memory 162.

The rest of the configuration and the function of the oscillator 1 according to the fourth embodiment are substantially the same as those of the third embodiment.

The oscillator 1 according to the fourth embodiment configured in such a manner as described above functions as the oven controlled oscillator similarly to the third embodiment. Further, the oscillator 1 according to the fourth embodiment automatically performs the preset temperature adjustment when being set to the preset temperature adjustment mode.

Method of Manufacturing Oscillator

Since the procedure of the method of manufacturing the oscillator 1 according to the fourth embodiment is substantially the same as shown in FIG. 14, the illustration and the explanation thereof will be omitted. It should be noted that the detailed procedure of the preset temperature adjustment process (S60 shown in FIG. 14) is different from that of the third embodiment, and will therefore be described below.

Figure 17:
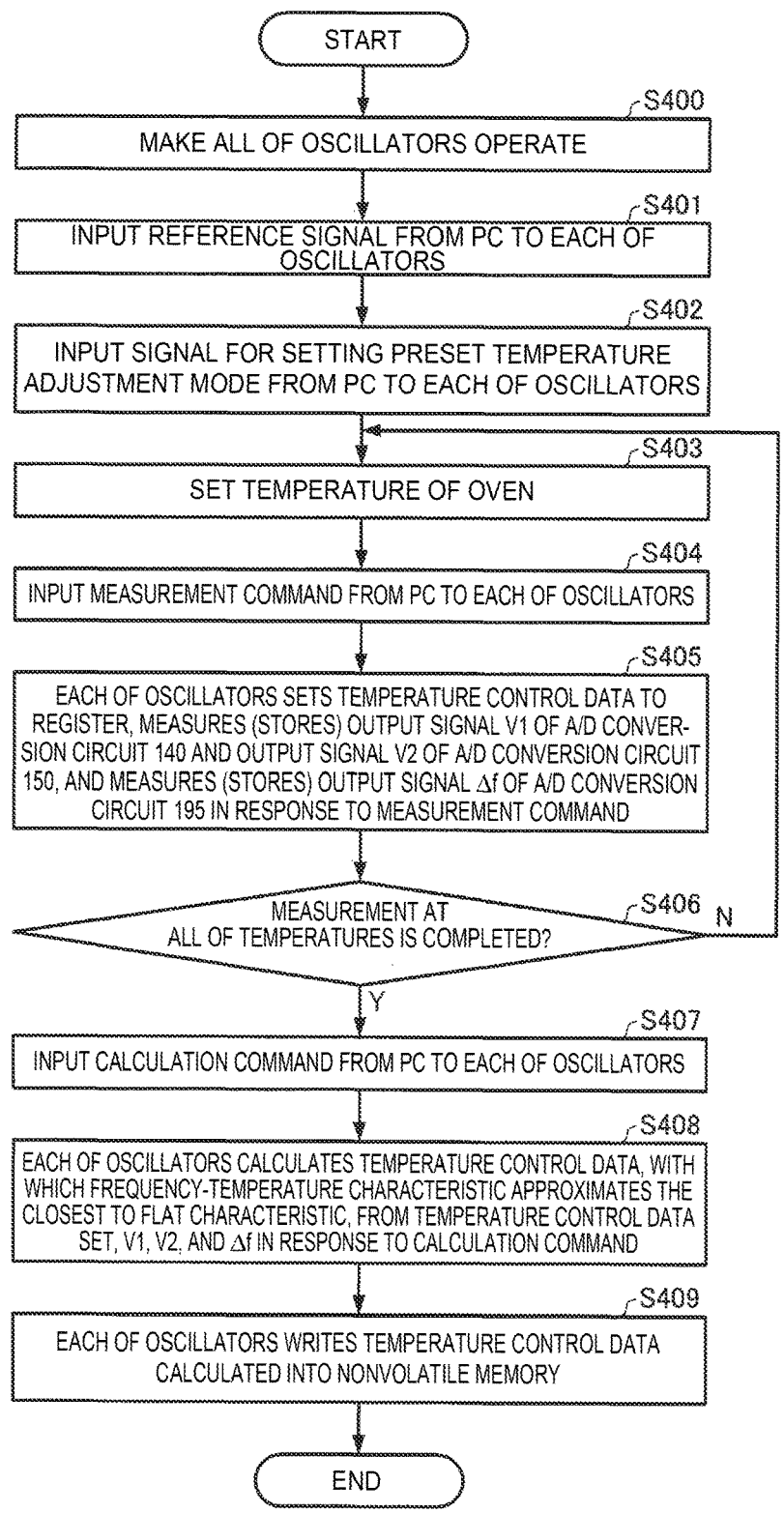
FIG. 17 is a flowchart showing an example of a detailed procedure of a preset temperature adjustment process in the fourth embodiment.

FIG. 17 is a flowchart showing an example of a detailed procedure of the preset temperature adjustment process (S60 in FIG. 14) in the fourth embodiment, and the procedure shown in FIG. 17 is performed by a system similar to the system shown in FIG. 10. It is also possible to eliminate or modify a part of the processes S400 through S409 shown in FIG. 17, or add other processes. Further, it is possible to arbitrarily change the order of the processes to the extent possible.

In the example shown in FIG. 17, firstly, the plurality of oscillators 1 mounted on the board is supplied with the power supply voltage to make all of the oscillators 1 operate (S400).

Then, the personal computer (PC) 210 inputs (S401) the reference signal with the predetermined frequency to each of the oscillators 1.

Then, the personal computer (PC) 210 inputs (S402) the signal for setting the preset temperature adjustment mode to each of the oscillators 1.

Then, the personal computer (PC) 210 sets (S403) the temperature (the temperature of the plurality of oscillators 1) of the oven 200 to a desired temperature (e.g., −40° C.)

Then, the personal computer (PC) 210 inputs (S404) the measurement command to each of the oscillators 1.

Then, in response to the measurement command, each of the oscillators 1 sets the predetermined temperature control data to the register 164, measures (stores) the output signal (the digital signal obtained by converting the output signal of the temperature sensor 8) V1 of the A/D conversion circuit 140 and the output signal (the digital signal obtained by converting the output signal of the heating control circuit 130) V2 of the A/D conversion circuit 150, and measures (stores) the output signal Δf of the A/D conversion circuit 195 (S405). In the process S405, each of the oscillators 1 sets the plurality of different temperature compensation data in sequence to the register 164, and obtains the output signals V1, V2, and Δf corresponding to each of the temperature compensation data.

Then, the personal computer (PC) 210 sets (S403) the temperature (the temperature of the plurality of oscillators 1) of the oven 200 to a different temperature (e.g., −30° C.), and then performs the processing of the process S404 and the process S405 again.

Similarly, the processing of the process S403 through the process S405 is repeated until the personal computer (PC) 210 completes the measurement at all of the measurement target temperatures included in the desired temperature range (e.g., −40° C. through +85° C.) in which the operation of the oscillator 1 is guaranteed (N in S406).

Then, when the personal computer (PC) 210 completes the measurement by the oscillators 1 at all of the measurement target temperatures (Y in S406), then the personal computer (PC) 210 inputs (S407) the calculation command to each of the oscillators 1.

Then, in response to the calculation command, each of the oscillators 1 calculates (determines) (S408) the temperature control data, with which the frequency-temperature characteristic approximates the closest to a flat characteristic, from the temperature control data set in the process S405, the output signals V1, V2 measured in the process S405, and the output signal Δf measured in the process S405. For example, each of the oscillators 1 calculates a relationship between the temperature control data thus set and the output signal V2, a relationship between the output signal V2 and the frequency F, and so on for each of the output signals V1, and then calculates the optimum temperature control data based on these relationships.

Then, each of the oscillators 1 writes (S409) the temperature control data calculated in the step S408 into the nonvolatile memory 162, and the preset temperature adjustment process is completed.

Advantages

As described hereinabove, the oscillator 1 according to the fourth embodiment is configured so that the arithmetic section 180 can measure the digital signal V1 obtained by digitalizing the output signal of the temperature sensor 8 by the A/D conversion circuit 140, and the digital signal V2 obtained by digitalizing the output signal of the heating control circuit 130 by the A/D conversion circuit 150. Further, since the digital signal V1 and the digital signal V2 are difficult to be deteriorated in accuracy by the noise, the arithmetic section 180 of each of the oscillators 1 can perform the preset temperature adjustment with high accuracy based on the measurement result of the digital signal V1 and the digital signal V2 even in the environment in which the noise is easily generated due to the operation of the plurality of oscillators 1. Therefore, according to the fourth embodiment, by reducing the error in the preset temperature adjustment, it is possible to improve the accuracy of the heating control of the heat generating element 7 to thereby realize the oscillator 1 capable of operating with high frequency accuracy. Further, the yield can be improved.

Further, according to the fourth embodiment, since the plurality of oscillators 1 can perform the preset temperature adjustment at the same time, the time necessary for the adjustment of the plurality of oscillators 1 can dramatically be reduced.

2. Electronic Apparatus

Figure 18:
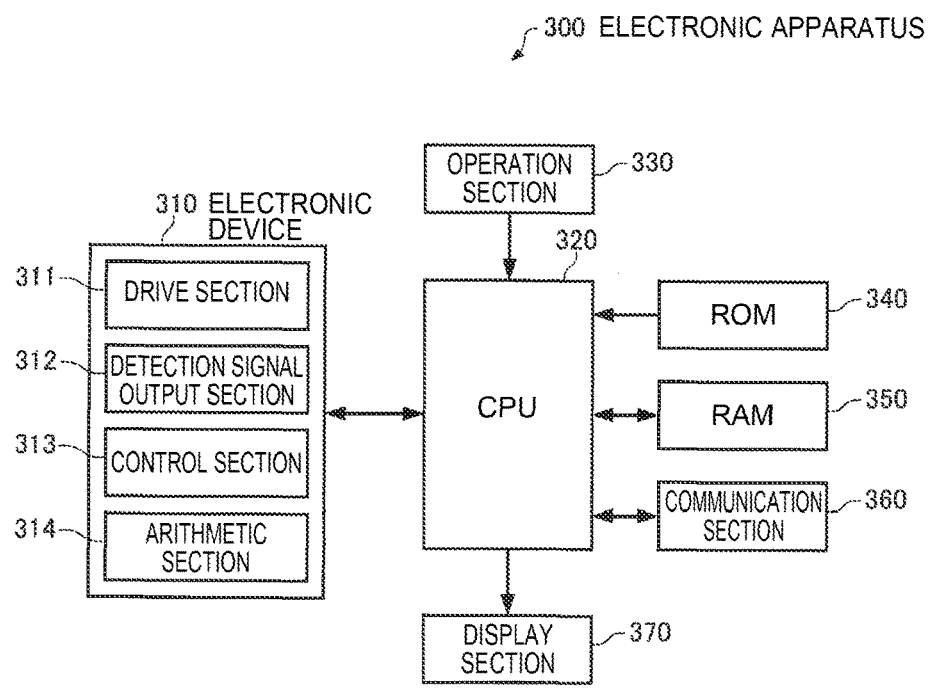
FIG. 18 is a functional block diagram showing an example of a configuration of an electronic apparatus according to an embodiment of the invention.
Figure 19:
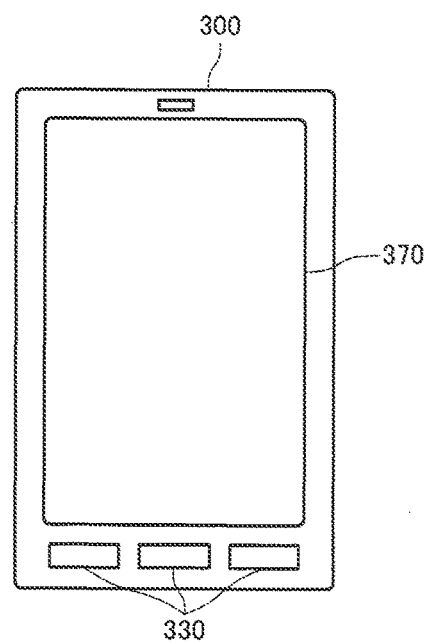
FIG. 19 is a diagram showing an example of an appearance of the electronic apparatus according to the embodiment.

FIG. 18 is a functional block diagram showing an example of a configuration of an electronic apparatus according to the embodiment. Further, FIG. 19 is a diagram showing an example of the appearance of a smartphone as an example of the electronic apparatus according to the present embodiment.

The electronic apparatus 300 according to the present embodiment is configured including an electronic device 310, a central processing unit (CPU) 320, an operation section 330, a read only memory (ROM) 340, a random access memory (RAM) 350, a communication section 360, and a display section 370. It should be noted that the electronic apparatus according to the present embodiment can be provided with a configuration obtained by eliminating or modifying some of the constituents (sections) shown in FIG. 18, or adding another constituent thereto.

The electronic device 310 includes a drive section 311, a detection signal output section 312 for generating a first analog signal having a value varying due to a variation of a physical quantity, and a control section 313 for generating a second analog signal controlled based on the first analog signal, and at the same time controlling the drive state of the drive section 311.

In the electronic device 310, at least the detection signal output section 312 and the control section 313 are provided to a substrate, and it is possible for the electronic device 310 to be able to output a first digital signal obtained by digitalizing the first analog signal and a second digital signal obtained by digitalizing the second analog signal from the substrate. Alternatively, the electronic device 310 further includes an arithmetic section 314 for measuring the first digital signal obtained by digitalizing the first analog signal and the second digital signal obtained by digitalizing the second analog signal to determine the operation condition based on the first digital signal and the second digital signal thus measured, and it is also possible for the control section 313 to control the drive state of the drive section 311 based on the operation condition thus set.

The CPU 320 (a processing section) performs a variety of calculation processes and control processes based on the output signal of the electronic device 310 in accordance with programs stored in the ROM 340 and so on. Specifically, the CPU 320 performs a variety of processes corresponding to the operation signal from the operation section 330, a process of controlling the communication section 360 for performing data communication with external devices, a process of transmitting a display signal for making the display section 370 display a variety of types of information, and so on.

The operation section 330 is an input device constituted by operation keys, button switches, and so on, and outputs the operation signal corresponding to the operation by the user to the CPU 320.

The ROM 340 stores the programs, data, and so on for the CPU 320 to perform the variety of types of arithmetic processing and control processing.

The RAM 350 is used as a working area of the CPU 320, and temporarily stores, for example, the programs and the data retrieved from the ROM 340, the data input from the operation section 330, and the calculation result obtained by the CPU 320 performing operations in accordance with the variety of types of programs.

The communication section 360 performs a variety of types of control processing for achieving the data communication between the CPU 320 and the external devices.

The display section 370 is a display device formed of a liquid crystal display (LCD) or the like, and displays a variety of types of information based on the display signal input from the CPU 320. The display section 370 can also be provided with a touch panel, which functions as the operation section 330.

By applying the electronic device such as the oscillator 1 according to any one of the embodiments described above as the electronic device 310, it is possible to realize an electronic apparatus high in reliability.

As such an electronic apparatus 300, a variety of electronic apparatuses can be adopted, and there can be cited, for example, a GPS (global positioning system) module, a network apparatus, a broadcast apparatus, a communication apparatus used in an artificial satellite or a base station, an electronic timepiece, a personal computer (e.g., a mobile type personal computer, a laptop personal computer, and a tablet personal computer), a mobile terminal such as a smartphone or a cellular phone, a digital camera, an inkjet ejection device (e.g., an inkjet printer), a storage area network apparatus such as a router or a switch, a local area network apparatus, a base station apparatus for a mobile terminal, a television set, a video camera, a video cassette recorder, a car navigation system, a real-time clock device, a pager, a personal digital assistance (including one having a communication function), an electronic dictionary, an electronic calculator, an electronic game machine, a gaming controller, a word processor, a workstation, a picture phone, a security television monitor, an electronic binoculars, a POS terminal, a medical instrument (e.g., an electronic thermometer, a blood pressure monitor, a blood glucose monitor, an electrocardiograph, ultrasonic diagnostic equipment, and an electronic endoscope), a fish finder, a variety of measuring instruments such as gas meter, gauges (e.g., gauges for cars, aircrafts, and boats and ships), a flight simulator, a head-mount display, a motion tracer, a motion tracker, a motion controller, and a pedestrian dead reckoning (PDR) system.

As an example of the electronic apparatus 300 according to the present embodiment, there can be cited a transmission device functioning as, for example, a terminal base station device for performing communication with terminals wirelessly or with wire using the electronic device 310 described above as a reference signal source. By applying, for example, the oscillator 1 according to any one of the embodiments described above as the electronic device 310, it is also possible to realize the electronic apparatus 300 which can be used for, for example, a communication base station, which is high in frequency accuracy, and for which high performance and high reliability are required.

Further, as another example of the electronic apparatus 300 according to the present embodiment, it is possible to adopt a communication device in which the communication section 360 receives an external clock signal, and the CPU 320 (the processing section) includes a frequency control section for controlling the frequency of the electronic device 310 based on the external clock signal and the output signal (an internal clock signal) of the electronic device 310. The communication device can be a communication apparatus used for, for example, a backbone network apparatus such as Stratum-3, or a femtocell.

3. Moving Object

Figure 20:
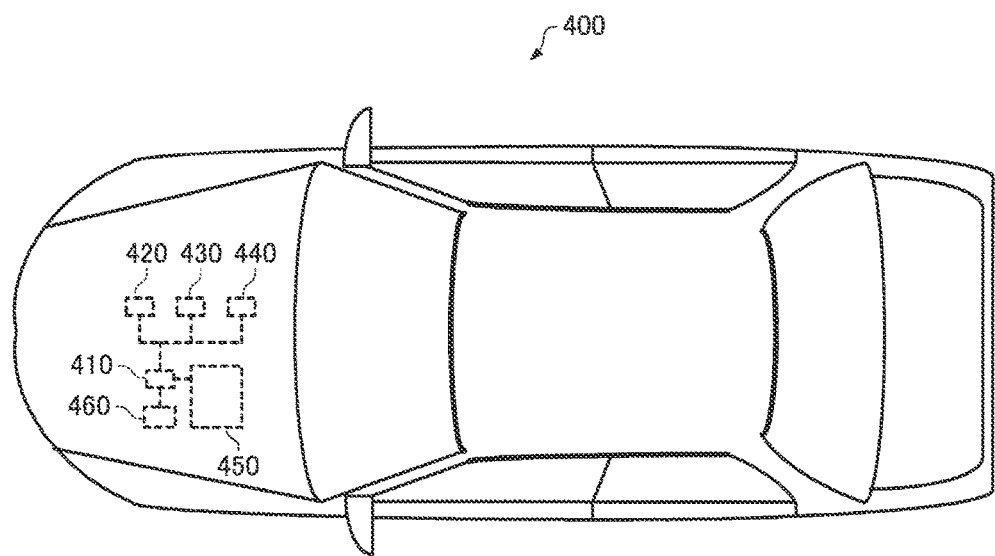
FIG. 20 is a diagram showing an example of a moving object according to an embodiment of the invention.

FIG. 20 is a diagram (a top view) showing an example of a moving object according to the present embodiment. The moving object 400 shown in FIG. 20 is configured including an electronic device 410, controllers 420, 430, and 440 for performing a variety of types of control such as an engine system, a brake system, or a keyless entry system, a battery 450, and a backup battery 460. It should be noted that the moving object according to the present embodiment can have a configuration obtained by eliminating some of the constituents (sections) shown in FIG. 20, or adding other constituents thereto.

The electronic device 410 includes a drive section (not shown), a detection signal output section (not shown) for generating a first analog signal having a value varying due to a variation of a physical quantity, and a control section (not shown) for generating a second analog signal controlled based on the first analog signal, and at the same time controlling the drive state of the drive section.

In the electronic device 410, at least the detection signal output section and the control section are provided to a substrate, and it is possible for the electronic device 410 to be able to output a first digital signal obtained by digitalizing the first analog signal and a second digital signal obtained by digitalizing the second analog signal from the substrate. Alternatively, the electronic device 410 further includes an arithmetic section (not shown) for measuring the first digital signal obtained by digitalizing the first analog signal and the second digital signal obtained by digitalizing the second analog signal to determine the operation condition based on the first digital signal and the second digital signal thus measured, and it is also possible for the control section to control the drive state of the drive section based on the operation condition thus set.

The controllers 420, 430, and 440 perform a variety of types of control based on the output signal of the electronic device 410.

The battery 450 supplies the electronic device 410 and the controllers 420, 430, and 440 with electrical power. The backup battery 460 supplies the electronic device 410 and the controllers 420, 430, and 440 with electrical power when the output voltage of the battery 450 drops to a level lower than a threshold value.

By applying the electronic device such as the oscillator 1 according to any one of the embodiments described above as the electronic device 410, it is possible to realize a moving object high in reliability.

As such a moving object 400, there can be adopted a variety of types of moving objects, and there can be cited a vehicle (including an electric vehicle), an aircraft such as a jet plane or a helicopter, a ship, a boat, a rocket, an artificial satellite, and so on.

The invention is not limited to the embodiments, but can be implemented with a variety of modifications within the scope or the spirit of the invention.

The embodiments and the modified examples described above are illustrative only, and the invention is not limited to the embodiments and the modified examples. For example, it is also possible to arbitrarily combine any of the embodiments and the modified examples described above with each other.

The invention includes configurations (e.g., configurations having the same function, the same way, and the same result, or configurations having the same object and the same advantage) substantially the same as the configuration described as the embodiment of the invention. Further, the invention includes configurations obtained by replacing a non-essential part of the configuration described as the embodiment of the invention. Further, the invention includes configurations providing the same functions and advantages and configurations capable of achieving the same object as the configuration described as the embodiment of the invention. Further, the invention includes configurations obtained by adding known technologies to the configuration described as one of the embodiments of the invention.

As described above, the electronic device according to the invention can be applied to a variety of electronic devices such as a variety of types of physical quantity sensors such as an angular velocity sensor or a acceleration sensor besides the oscillator. Further, as the physical quantity, there can be adopted the angular velocity, or the acceleration, and in the case in which, for example, the electronic device is an angular velocity sensor, the acceleration can be cited as a physical quantity to be a disturbance, and in the case in which the electronic device is an acceleration sensor, the angular velocity (Coriolis force) can be cited as a physical quantity to be a disturbance.

The entire disclosure of Japanese Patent Application No. 2015-168817, filed Aug. 28, 2015 is expressly incorporated by reference herein.

What is claimed is:

1. An electronic device comprising:
   a drive section;
   a detection signal output section adapted to generate a first analog signal having a value varying in accordance with a physical quantity; and
   a control section adapted to generate a second analog signal based on the first analog signal, and adapted to control a drive state of the drive section, wherein:
   at least the detection signal output section and the control section are provided to a substrate,
   a first digital signal obtained by digitalizing the first analog signal and a second digital signal obtained by digitalizing the second analog signal can be output from the substrate,
   the first analog signal corresponds to temperature information,
   the drive section includes an oscillation circuit,
   the control section includes a stabilization function adapted to stabilize a temperature characteristic of a frequency signal output by the oscillation circuit, and
   the second analog signal corresponds to information representing an operation state of the stabilization function.

2. An electronic device comprising:
   a drive section;
   a detection signal output section adapted to generate a first analog signal having a value varying in accordance with a physical quantity;
   a control section adapted to generate a second analog signal based on the first analog signal, and adapted to control a drive state of the drive section based on an operation condition; and
   an arithmetic section adapted to determine the operation condition based on a first digital signal obtained by digitalizing the first analog signal and a second digital signal obtained by digitalizing the second analog signal, wherein:
   at least the detection signal output section and the control section are provided to a substrate, the first analog signal corresponds to temperature information, the drive section includes an oscillation circuit, the control section includes a stabilization function adapted to stabilize a temperature characteristic of a frequency signal output by the oscillation circuit, and the second analog signal corresponds to information representing an operation state of the stabilization function.

3. The electronic device according to claim 1, wherein the oscillation circuit includes a reactance circuit to be voltage-controlled disposed in a feedback circuit, and the second analog signal is a signal adapted to voltage-control reactance of the reactance circuit to compensate the temperature characteristic.

4. The electronic device according to claim 2, wherein the oscillation circuit includes a reactance circuit to be voltage-controlled disposed in a feedback circuit, and the second analog signal is a signal adapted to voltage-control reactance of the reactance circuit to compensate the temperature characteristic.

5. The electronic device according to claim 1, further comprising:

a heat generating section controlled in heat generation value based on the second analog signal, wherein the heat generating section heats the drive section.

6. The electronic device according to claim 2, further comprising:

a heat generating section controlled in heat generation value based on the second analog signal, wherein the heat generating section heats the drive section.

7. The electronic device according to claim 1, further comprising:

an analog-to-digital conversion section adapted to perform the digitalization of the first analog signal and the second analog signal.

8. The electronic device according to claim 2, further comprising:

an analog-to-digital conversion section adapted to perform the digitalization of the first analog signal and the second analog signal.

9. A method of manufacturing an electronic device comprising:

assembling the electronic device including a drive section, a detection signal output section adapted to generate a first analog signal having a value varying due to a variation of a physical quantity, and a control section, including a stabilization function, adapted to generate a second analog signal controlled based on the first analog signal, and control a drive state of the drive section based on an operation condition set;

setting a temperature of the electronic device;

measuring a first digital signal obtained by digitalizing the first analog signal and a second digital signal obtained by digitalizing the second analog signal at a temperature of the electronic device; and determining the operation condition of the stabilization function based on the first digital signal and the second digital signal measured.

10. The method of manufacturing the electronic device according to claim 9, wherein the measuring is performed in a state of making a plurality of electronic devices operate.

11. An electronic apparatus comprising:

the electronic device according to claim 1.

12. A moving object comprising:

the electronic device according to claim 1.

* * * * *